US011251163B2

(12) United States Patent
Hori et al.

(10) Patent No.: US 11,251,163 B2
(45) Date of Patent: Feb. 15, 2022

(54) SEMICONDUCTOR DEVICE HAVING CIRCUIT BOARD INTERPOSED BETWEEN TWO CONDUCTOR LAYERS

(71) Applicant: FUJI ELECTRIC CO., LTD., Kawasaki (JP)

(72) Inventors: Motohito Hori, Matsumoto (JP); Yoshinari Ikeda, Matsumoto (JP); Akira Hirao, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/084,413

(22) Filed: Oct. 29, 2020

(65) Prior Publication Data

US 2021/0193628 A1 Jun. 24, 2021

(30) Foreign Application Priority Data

Dec. 18, 2019 (JP) .............................. JP2019-227825

(51) Int. Cl.
*H01L 29/76* (2006.01)
*H01L 23/495* (2006.01)
(Continued)

(52) U.S. Cl.
CPC ........ *H01L 25/072* (2013.01); *H01L 23/5381* (2013.01); *H01L 23/5383* (2013.01);
(Continued)

(58) Field of Classification Search
CPC ... H01L 2924/13055; H01L 2924/2924; H01L 2924/13091; H01L 2924/13062;
(Continued)

(56) References Cited

U.S. PATENT DOCUMENTS 5,006,921 A 4/1991 Ishizuka et al.
5,459,655 A 10/1995 Mori et al.
(Continued)

FOREIGN PATENT DOCUMENTS

JP H02-94448 A 4/1990
JP H05-206449 A 8/1993
(Continued)

OTHER PUBLICATIONS

Ayato Sagehashi et al., "Consideration for difference of parasitic inductance caused by DC bus structure on printed boards", Meeting on Electron Devices and Semiconductor Power Converter, EDD-13-057, SPC-13-119, Oct. 21, 2013.

*Primary Examiner* — Alonzo Chambliss
(74) *Attorney, Agent, or Firm* — Rabin & Berdo, P.C.

(57) ABSTRACT

A semiconductor device having a semiconductor module that includes a first conductor layer and a second conductor layer facing each other, a group of semiconductor elements that are formed between the first and second conductor layers, and are connected to the second conductor layer respectively via a group of conductor blocks, and a circuit board having one end portion thereof located in a space between the semiconductor elements and the second conductor layer. Each semiconductor element includes first and second main electrodes respectively formed on first and second main surfaces thereof, and a control electrode that is formed on the second main surface. The first main electrode is electrically connected to the first conductor layer. The second main electrode is electrically connected to the second conductor layer via the respective conductor block. The circuit board includes a first wiring layer electrically connected to the control electrodes of the semiconductor elements.

9 Claims, 22 Drawing Sheets

(51) Int. Cl.

| | |
|---|---|
| *H01L 23/34* | (2006.01) |
| *H01L 23/48* | (2006.01) |
| *H01L 21/00* | (2006.01) |
| *H05K 7/00* | (2006.01) |
| *H05K 1/18* | (2006.01) |
| *H01R 9/00* | (2006.01) |
| *H01L 25/07* | (2006.01) |
| *H01L 23/538* | (2006.01) |
| *H01L 23/00* | (2006.01) |
| *H01L 23/367* | (2006.01) |

(52) U.S. Cl.
CPC .......... *H01L 24/32* (2013.01); *H01L 23/3672* (2013.01); *H01L 2924/13055* (2013.01); *H01L 2924/13062* (2013.01); *H01L 2924/13091* (2013.01)

(58) Field of Classification Search
CPC ... H01L 24/32; H01L 25/072; H01L 23/5381; H01L 23/5383
See application file for complete search history.

(56) References Cited

U.S. PATENT DOCUMENTS

| | | | |
|---|---|---|---|
| 2003/0141587 A1 | 7/2003 | Frey | |
| 2004/0195649 A1 | 10/2004 | Miura et al. | |
| 2008/0251909 A1 | 10/2008 | Tokuyama et al. | |
| 2009/0231810 A1* | 9/2009 | Liang | H01L 23/473 |
| | | | 361/699 |
| 2009/0243089 A1 | 10/2009 | Hohlfeld et al. | |
| 2011/0037166 A1 | 2/2011 | Ikeda et al. | |
| 2012/0087095 A1 | 4/2012 | Tokuyama et al. | |
| 2013/0020694 A1* | 1/2013 | Liang | H01L 25/072 |
| | | | 257/691 |
| 2014/0138707 A1 | 5/2014 | Miki et al. | |
| 2014/0246783 A1* | 9/2014 | Nishizawa | H01L 23/4334 |
| | | | 257/774 |
| 2015/0223339 A1 | 8/2015 | Nakamura et al. | |
| 2016/0343641 A1 | 11/2016 | Hori et al. | |
| 2017/0309544 A1 | 10/2017 | Kobayashi et al. | |
| 2019/0074236 A1 | 3/2019 | Fuku et al. | |

FOREIGN PATENT DOCUMENTS

| | | |
|---|---|---|
| JP | 2004-296588 A | 10/2004 |
| JP | 2006-502560 A | 1/2006 |
| JP | 2007-012685 A | 1/2007 |
| JP | 2008-103623 A | 5/2008 |
| JP | 2008-259267 A | 10/2008 |
| JP | 2010-258315 A | 11/2010 |
| JP | 2012-119651 A | 6/2012 |
| JP | 2016-046279 A | 4/2016 |
| JP | 2016-066660 A | 4/2016 |
| JP | 2016-167635 A | 9/2016 |
| JP | 2019-050300 A | 3/2019 |
| WO | 2009/125779 A1 | 10/2009 |
| WO | 2014/061211 A1 | 4/2014 |
| WO | 2015/029511 A1 | 3/2015 |
| WO | 2016/031462 A1 | 3/2016 |
| WO | 2016/121159 A1 | 8/2016 |
| WO | 2017/203650 A1 | 11/2017 |

* cited by examiner

SEMICONDUCTOR DEVICE HAVING CIRCUIT BOARD INTERPOSED BETWEEN TWO CONDUCTOR LAYERS

CROSS-REFERENCE TO RELATED APPLICATION

This application is based upon and claims the benefit of priority of the prior Japanese Patent Application No. 2019-227825, filed on Dec. 18, 2019, the entire contents of which are incorporated herein by reference.

BACKGROUND OF THE INVENTION

1. Field of the Invention

The embodiments discussed herein relate to a semiconductor device having a circuit board interposed between two conductor layers.

2. Background of the Related Art

Inverter apparatuses, uninterruptible power supply apparatuses, machine tools, industrial robots, etc. use semiconductor devices using semiconductor elements, such as insulated gate bipolar transistors (IGBTs) and power metal-oxide-semiconductor field-effect transistors (MOSFETs), separately from or as a part of their respective main body apparatuses.

There are known techniques in relation to these semiconductor devices. For example, in one technique, a group of submodules including semiconductor elements are formed between metal members facing each other. Two main surfaces of an individual submodule are bonded to the respective metal members facing each other. In addition, a multilayer wiring board electrically connected to the submodule group is formed between the submodule groups and in an area where no component is formed. In another technique, for example, a semiconductor element is formed between large-current leads facing each other. A main surface of the semiconductor element is bonded to one of the large-current leads, and the other main surface is bonded to a multilayer wiring board having a through hole. This multilayer wiring board is bonded to the other large-current lead.

See, for example, Japanese Laid-open Patent Publication No. 2019-50300

See, for example, Japanese Laid-open Patent Publication No. 2007-12685

Such a semiconductor device using a multilayer wiring board as described above could have a large size in a thickness or planar direction, depending on the location of the multilayer wiring board. In addition, depending on the connection between the multilayer wiring board and a semiconductor element or the connection between the multilayer wiring board and a conductor such as a metal member or a large-current lead, an electrical signal for controlling switching of the semiconductor element could not be supplied stably to the semiconductor element. In this case, the operation performance of the semiconductor element is deteriorated.

SUMMARY OF THE INVENTION

According to one aspect, there is provided a semiconductor device, including: a semiconductor module including a first conductor layer, a second conductor layer that faces the first conductor layer, a group of semiconductor elements formed between the first conductor layer and the second conductor layer, a group of conductor blocks that are formed between the second conductor layer and the group of semiconductor elements, and respectively via which the group of semiconductor elements are connected to the second conductor layer, a space being formed between the second conductor layer and the group of semiconductor elements, and a circuit board having one end portion thereof located in said space, wherein each of the semiconductor elements includes a first main electrode that is formed on a first main surface thereof facing the first conductor layer and that is electrically connected to the first conductor layer, a second main electrode that is formed on a second main surface thereof facing the second conductor layer and that is electrically connected to the second conductor layer via the respective conductor block, and a control electrode that is formed on the second main surface, and wherein the circuit board includes a first wiring layer electrically connected to the control electrodes of the semiconductor elements.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

First Embodiment

Figure 1:
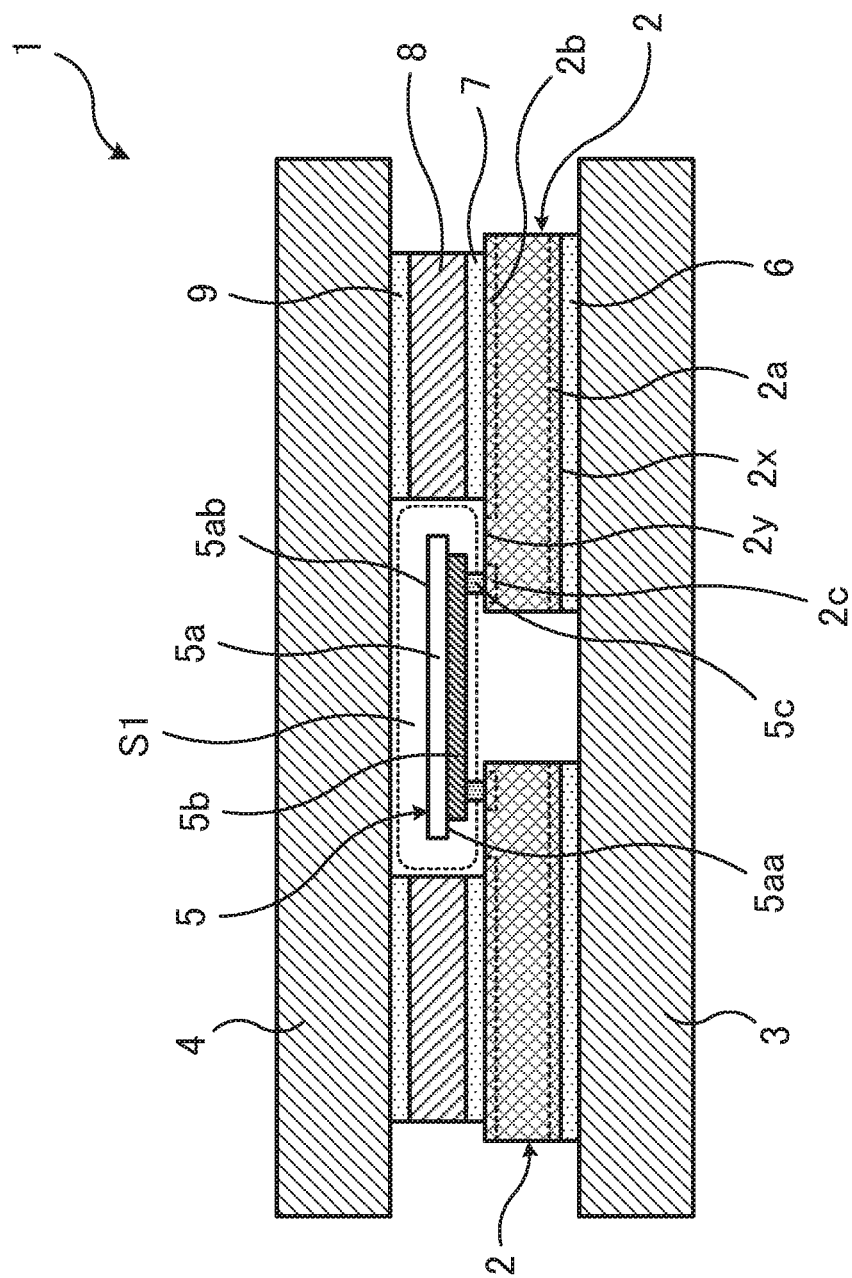
FIG. 1 illustrates a first example of a semiconductor device according to a first embodiment.

FIG. 1 illustrates a first example of a semiconductor device according to a first embodiment. FIG. 1 is a schematic cross section of a main part of an example of a semiconductor device.

This semiconductor device 1 (a semiconductor module) illustrated in FIG. 1 includes a plurality of semiconductor elements 2 (in FIG. 1, two semiconductor elements 2 in a section view, for example), a conductor layer 3 and a conductor layer 4 that face each other via the plurality of semiconductor elements 2, and a circuit board 5 connected to the plurality of semiconductor elements 2.

Various kinds of semiconductor elements (semiconductor chips) may be used as the semiconductor elements 2. For example, semiconductor chips including IGBTs, MOSFETs, power MOSFETs, junction field-effect transistors (JFETs), high electron mobility transistors (HEMTs), or the like may be used as the semiconductor elements 2. Alternatively, reverse blocking IGBTs (RB-IGBTs) having reverse voltage properties may be used as the semiconductor elements 2. A reverse conducting IGBT (RC-IGBT) in which an IGBT is connected in inverse parallel to a diode (a freewheeling diode (FWD)) may be used as an individual semiconductor element 2. An RB-IGBT or an RC-IGBT obtained by including an FWD in a semiconductor chip may be used.

The same kind of or different kinds of semiconductor elements 2 may be used as the plurality of semiconductor elements 2.

Various kinds of conductor material may be used as the conductor layers 3 and 4 that face each other via the semiconductor elements 2. For example, conductor material such as copper (Cu), silver (Ag), or aluminum (Al) is used for the conductor layers 3 and 4. For example, conductor layers having the same shape or size or equivalent shapes or sizes are used as the conductor layers 3 and 4. Various modes of conductor layers such as conductor plates, conductive foil, conductive sheets, or conductive film may be used as the conductor layers 3 and 4. The conductor layers 3 and 4 may be formed on insulating plates. Lead frames may be used as the conductor layers 3 and 4.

The individual semiconductor element 2 includes a positive-side main electrode (a positive electrode) 2a formed on one main surface 2x and a negative-side main electrode (a negative electrode) 2b and a control electrode 2c formed on the other main surface 2y. For example, the positive electrode 2a functions as a collector electrode or a drain electrode, and the negative electrode 2b functions as an emitter electrode or a source electrode. The control electrode 2c functions as a base electrode or a gate electrode.

The positive electrodes 2a and the negative electrodes 2b of the plurality of semiconductor elements 2 are formed between the conductor layers 3 and 4 facing each other and are formed in the direction of the conductor layers 3 and 4, respectively. The positive electrodes 2a of the plurality of semiconductor elements 2 are electrically and mechanically connected to the conductor layer 3 via bonding material 6. Various kinds of bonding material having certain electrical conductivity and thermal conductivity such as sintered material or solder of copper or silver may be used as the bonding material 6. The negative electrodes 2b of the plurality of semiconductor elements 2 are electrically and mechanically connected to the conductor layer 4 via bonding material 7, conductor blocks 8, and bonding material 9. Various kinds of bonding material having certain electrical conductivity and thermal conductivity such as sintered material or solder of copper or silver may be used as the bonding material 7 and the bonding material 9. Various kinds of conductor material having certain electrical conductivity and thermal conductivity such as copper, silver, or aluminum may be used for the conductor blocks 8. The individual negative electrode 2b and the corresponding conductor block 8 are bonded to each other by the bonding material 7, and the individual conductor block 8 and the conductor layer 4 are bonded to each other by the bonding material 9.

The plurality of semiconductor elements 2 generate heat when operated. The heat generated by the plurality of semiconductor elements 2 is transferred to the conductor layer 3 via the bonding material 6 and to the conductor layer 4 via the bonding material 7, the conductor blocks 8, and the bonding material 9. The individual conductor blocks 8 function as heat spreaders that transfer the heat generated by the plurality of semiconductor elements 2 to the conductor layer 4. The conductor blocks 8 also function as spacers for forming a certain space S1 between the plurality of semiconductor elements 2 and the conductor layer 4.

The circuit board 5 is formed in the space S1 formed between the conductor layer 4 and the plurality of semiconductor elements 2 connected to each other via the conductor blocks 8 (and the bonding material 7 and the bonding material 9). As will be described below, one end portion (corresponding to the cross-section portion illustrated in FIG. 1) of the circuit board 5 is located in the space S1 formed between the conductor layer 4 and the plurality of semiconductor elements 2, and the other end portion (not illustrated in FIG. 1) is formed to extend to the outside of the conductor layers 3 and 4.

The circuit board 5 includes an insulating layer 5a and a wiring layer 5b formed thereon. The wiring layer 5b is formed on at least one of a main surface 5aa of the insulating layer 5a and a main surface 5ab opposite to the main surface 5aa. FIG. 1 illustrates, as an example, the wiring layer 5b formed on the main surface 5aa of the insulating layer 5a.

Any one of various kinds of insulating material may be used for the insulating layer 5a. For example, inorganic insulating material such as aluminum oxide, aluminum nitride, silicon nitride, or silica or organic insulating material such as epoxy resin, phenol resin, or polyimide resin may be used for the insulating layer 5a. Fiber or cloth such as insulating filler or glass may be contained in the organic insulating material. Any one of various kinds of conductor material may be used for the wiring layer 5b. For example, conductor material such as copper or a copper alloy may be used for the wiring layer 5b.

The wiring layer 5b is electrically and mechanically connected to the control electrodes 2c of the plurality of semiconductor elements 2 via connection portions 5c. Any one of various modes such as bumps, pins, pillars, or posts may be used as the connection portions 5c. If bumps are used as the connection portions 5c, conductor material such as solder or gold is used, for example. If pins, pillars, or posts are used as the connection portions 5c, conductor material such as copper, silver, or aluminum is used, for example. The connection portions 5c may previously be formed on the circuit board 5 and connected to the wiring layer 5b. Alternatively, the connection portion 5c may previously be formed on the semiconductor elements 2 and connected to the control electrodes 2c.

The plurality of semiconductor elements 2, the conductor layers 3 and 4, and the circuit board 5 of the semiconductor device 1 may be sealed by resin. In this case, the conductor layers 3 and 4 are provided with the positive-side main terminal (positive terminal) and the negative-side main terminal (negative terminal) that extend to the outside of the resin at least partially. In addition, if the above components are sealed by resin, main surfaces of the conductor layers 3 and 4, these surfaces being opposite to their main surfaces near the semiconductor elements 2 formed between the conductor layers 3 and 4, may be exposed in the resin. In this way, the heat generated by the plurality of semiconductor elements 2 is released more effectively.

Alternatively, any one of various kinds of cooling members may be thermally and mechanically connected to the main surfaces of the conductor layers 3 and 4, the main surfaces being opposite to their main surfaces near the semiconductor elements 2 formed between the conductor layers 3 and 4, directly or via thermal interface material (TIM). For example, each of the conductor layers 3 and 4 may be connected to a cooling member that has or that does not have a fin on its outer side, a cooling member that includes a circulation path (a refrigerant flow path) for liquid or gaseous refrigerant, or a cooling member that uses evaporation and condensation of internally sealed operating fluid.

Figure 2:
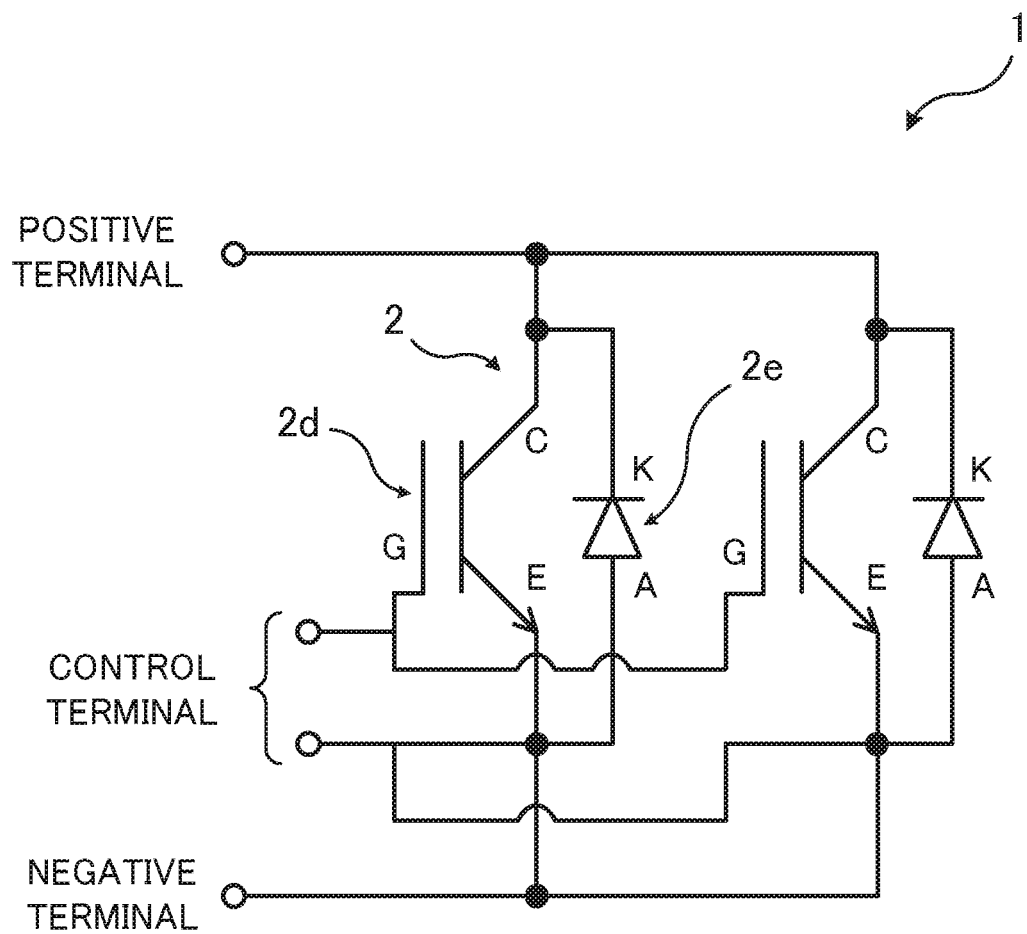
FIG. 2 illustrates an example of a circuit in the semiconductor device.

FIG. 2 illustrates an example of a circuit of the semiconductor device.

FIG. 2 illustrates an equivalent circuit of an example of a circuit configurable in the semiconductor device 1 having the configuration as described in FIG. 1. In the example in FIG. 2, two semiconductor elements 2 are illustrated, each of which is an RC-IGBT configured by forming an IGBT 2d and an FWD 2e in a single semiconductor chip. In the individual RC-IGBT, a collector electrode C of the IGBT 2d is connected to a cathode electrode K of the FWD 2e, and an emitter electrode E of the IGBT 2d is connected to an anode electrode A of the FWD 2e.

As described above, in the case of the semiconductor device 1, the positive electrode 2a of the individual semiconductor element 2 is electrically connected to the conductor layer 3 functioning as the positive electrode via the corresponding bonding material 6. Namely, as illustrated in FIG. 2, the collector electrode C of an RC-IGBT, the collector electrode C corresponding to the positive electrode 2a of a semiconductor element 2, is electrically connected to the positive terminal (FIG. 2) formed in or connected to the conductor layer 3.

As described above, in the case of the semiconductor device 1, the negative electrode 2b of the individual semiconductor element 2 is electrically connected to the conductor layer 4 functioning as the negative electrode via the corresponding bonding material 7, conductor block 8, and bonding material 9. That is, as illustrated in FIG. 2, the emitter electrode E of an RC-IGBT, the emitter electrode E corresponding to the negative electrode 2b of a semiconductor element 2, is electrically connected to the negative terminal (FIG. 2) formed in or connected to the conductor layer 4.

In the case of the semiconductor device 1, the control electrode 2c of the individual semiconductor element 2 is electrically connected to the wiring layer 5b of the circuit board 5 via the corresponding connection portion 5c. In addition, in the case of the semiconductor device 1 having RC-IGBTs as the semiconductor elements 2, in order to apply a predetermined voltage for switching control across the control electrode 2c and the negative electrode 2b of the individual semiconductor element 2, the negative electrode 2b of the individual semiconductor element 2 is also electrically connected to the circuit board 5 (this is not illustrated in FIG. 1). That is, as illustrated in FIG. 2, the gate electrodes G of the RC-IGBTs, the gate electrodes G corresponding to the control electrodes 2c of the semiconductor elements 2, are electrically connected to a control terminal (FIG. 2) formed in or connected to the circuit board 5 (or the wiring layer 5b thereof). In addition, the emitter electrodes E of the RC-IGBTs, the emitter electrodes E corresponding to the negative electrodes 2b of the two semiconductor elements 2, are electrically connected to a control terminal (FIG. 2) formed in or connected to the circuit board 5.

As the individual negative electrode electrically connected to the control terminal, a sensing electrode whose potential is equivalent to that of the negative electrode may be used. The following embodiments will be made assuming that a negative electrode that is integrally formed with a sensing electrode is used.

For example, the semiconductor device 1 may have a circuit configuration in which two RC-IGBT as the two semiconductor elements 2 are connected in parallel to each other as illustrated in FIG. 2.

In this case, when the semiconductor device 1 is operated, a switching control voltage for controlling ON and OFF states of the two semiconductor elements 2 is applied across the control electrode 2c (the gate electrode G) and the negative electrode 2 (the emitter electrode E) of the individual one of the two semiconductor elements 2 via the circuit board 5. In addition, a main current voltage for causing a main current to flow from the positive electrode 2a to the negative electrode 2b of the individual one of the two semiconductor elements 2 is applied across the conductor layer 3 connected to the positive electrode 2a (the collector electrode C) and the conductor layer 4 connected to the negative electrode 2b (the emitter electrode E) of the individual one of the two semiconductor elements 2.

A predetermined ON voltage is applied when the semiconductor elements 2 are switched from OFF to ON. In this operation, a current for charging the gates flows through the control electrodes 2c from the circuit board 5, and a current flows through the negative electrodes 2b from the circuit board 5. As a result, the semiconductor elements 2 are set to the ON state, and a current flows through the positive electrodes 2a of the two semiconductor elements 2 from the conductor layer 3. In addition, a current flows through the conductor layer 4 from the negative electrodes 2b of the two semiconductor elements 2.

A predetermined OFF voltage lower than the ON voltage is applied when the semiconductor elements 2 are switched from ON to OFF. In this operation, a current for discharging the gates flows through the circuit board 5 from the control electrodes 2c, and a current flows through the negative electrodes 2b from the circuit board 5. As a result, the semiconductor elements 2 are set to the OFF state, and the current flowing through the positive electrodes 2a of the two semiconductor elements 2 from the conductor layer 3 is stopped. In addition, the current flowing through the conductor layer 4 from the negative electrodes 2b of the two semiconductor elements 2 is also stopped.

For example, the semiconductor device 1 having the above configuration is formed.

In the case of the semiconductor device 1, as illustrated in FIG. 1, the circuit board 5 is formed in the space S1 formed between the conductor layer 4 and the plurality of semiconductor elements 2 connected to each other via the bonding material 7, the conductor blocks 8, and the bonding material 9. In addition, the control electrodes 2c (and the negative electrodes 2b) of the individual semiconductor elements 2 are connected to the circuit board 5. For example, there is a mode in which a wiring pattern such as a land for applying a voltage to the control electrodes 2c is formed in the same level as the conductor layer 3 but separately from the conductor layer 3. In this mode, the wiring pattern and the control electrodes 2c are connected by wire bonding. Compared with this mode, the above semiconductor device 1 is allowed to have a smaller size. That is, since the semiconductor device 1 does not need the wiring pattern, the conductor layer 3 (and the conductor layer 4 opposite thereto) is allowed to have smaller sizes in planar directions. In addition, compared with a case in which a wiring pattern is formed between a plurality of semiconductor elements 2 and is connected to the control electrodes 2c by wire bonding, the distance between the plurality of semiconductor elements 2 is shortened. As a result, the conductor layer 3 (and the conductor layer 4 opposite thereto) on which the wiring pattern is mounted is allowed to have smaller sizes in planar directions. In addition, since no wire bonding is needed on the control electrodes 2c, the conductor blocks 8 are allowed to have a smaller thickness.

In addition, in the case of the semiconductor device 1, the conductor layers 3 and 4 are formed in the directions of the main surfaces 2x and 2y, respectively, of the individual semiconductor element 2. Thus, compared with a case in which a conductor layer is formed only near one main surface, the heat radiation efficiency and the cooling efficiency of the semiconductor elements 2 are improved. As a result, overheating of the semiconductor elements 2 is reduced. In addition, since the conductor blocks 8 of the semiconductor device 1 are allowed to have a smaller thickness as described above, thermal resistance between the individual semiconductor elements 2 and the conductor layer 4 is reduced, and overheating of the individual semiconductor elements 2 is consequently reduced. Since overheating of the individual semiconductor elements 2 of the semiconductor device 1 is reduced, occurrence of breakage of the semiconductor elements 2 due to overheating is reduced. Since overheating of the individual semiconductor elements 2 of the semiconductor device 1 and occurrence of breakage of the individual semiconductor elements 2 due to overheating are reduced, a larger current is allowed to flow through the semiconductor elements 2.

In addition, in the case of the semiconductor device 1, the switching control voltage is applied to the control electrodes 2c (and the negative electrodes 2b that function as sensing electrodes) of the individual semiconductor elements 2 via the circuit board 5, and the main current voltage is applied to the negative electrodes 2b via the conductor layer 4, the bonding material 9, the conductor blocks 8, and the bonding material 7. In this way, the semiconductor elements 2 achieve better operation controllability, compared with, for example, a case in which a single multilayer wiring board including through holes is formed between at least one semiconductor element and the conductor layer 4 and in which the switching control voltage and the main current voltage are applied to the control electrode 2c and the negative electrode 2b, respectively, via the multilayer wiring board. That is, the paths of switching control electrical signals supplied to the control electrodes 2c (a voltage that is applied and a current that flows thereby) are separated from the paths of main current electrical signals supplied to the negative electrodes 2b (a voltage that is applied and a main current that flows thereby). Thus, the electrical signals that flow through the paths to the control electrodes 2c are less affected by the electromagnetic field of the main current that flows through the paths to the negative electrodes 2b. Since the impact by the electromagnetic field is reduced, the controllability of the operation of the semiconductor elements 2 is improved.

In addition, since the conductor blocks 8 of the semiconductor device 1 are allowed to have a smaller thickness as described above, the distance between the conductor layers 3 and 4 through which the main current flows is shortened, and the mutual inductance is increased. Therefore, the total inductance at the time of switching control of the semiconductor elements 2 is reduced.

In addition, the circuit board 5 of the semiconductor device 1 is formed over the plurality of semiconductor elements 2 formed side by side on the conductor layer 3. In this way, since the length of an electrical signal path from a semiconductor element 2 to the circuit board 5 is made equal to that of an electrical signal path from the other semiconductor element 2 to the circuit board 5, the controllability of the operation of the two semiconductor elements 2 is improved.

The above configuration enables the semiconductor device 1 to have a small size and semiconductor elements 2 having excellent operation performance.

Figure 3:
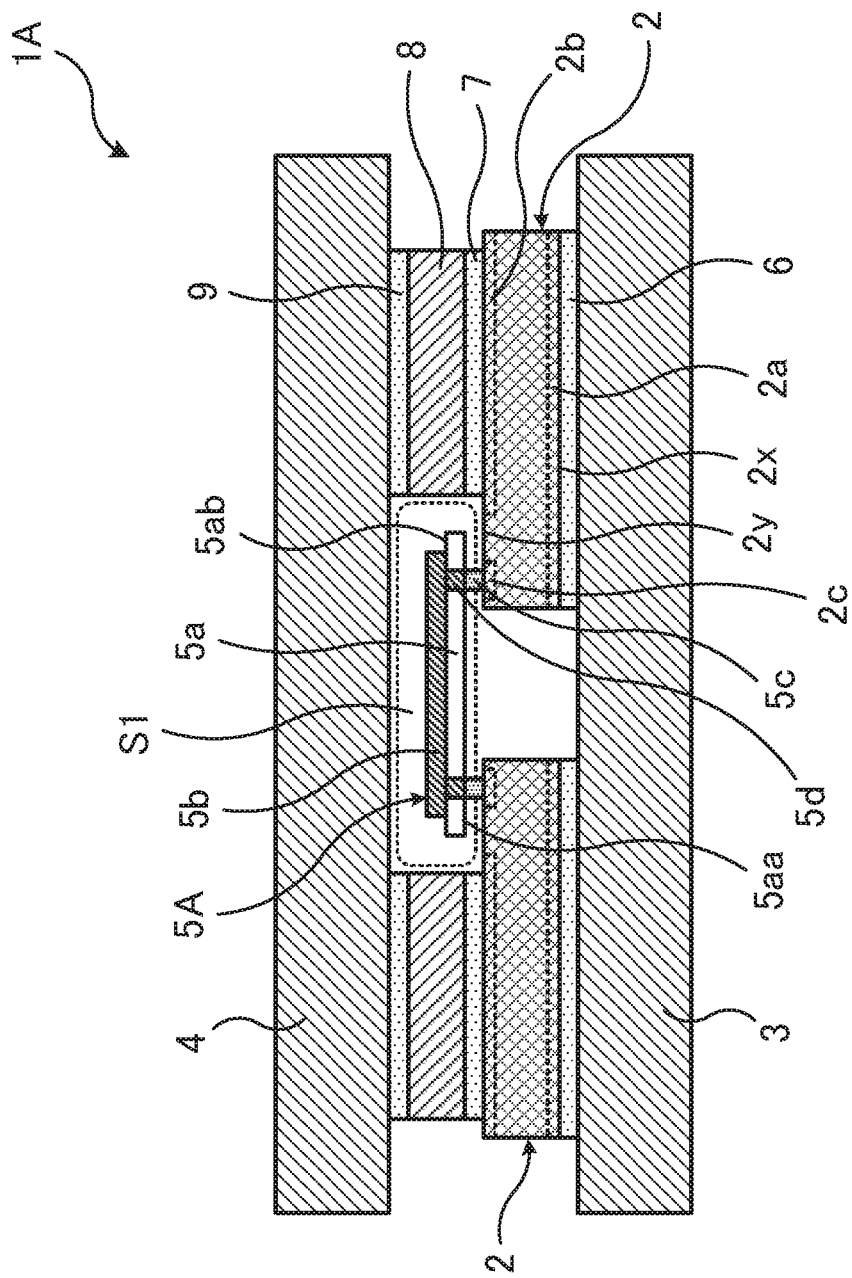
FIG. 3 illustrates a second example of the semiconductor device according to the first embodiment.

FIG. 3 illustrates a second example of the semiconductor device according to the first embodiment. FIG. 3 is a schematic cross section of a main part of an example of the semiconductor device.

This semiconductor device 1A illustrated in FIG. 3 differs from the semiconductor device 1 illustrated in FIG. 1 in that a circuit board 5A is used. Specifically, a wiring layer 5b is formed on a main surface 5ab opposite to a main surface 5aa of an insulating layer 5a. The circuit board 5A is formed in a space S1 formed between a conductor layer 4 and a plurality of semiconductor elements 2 connected to each other via bonding material 7, conductor blocks 8, and bonding material 9.

The wiring layer 5b formed on the main surface 5ab of the insulating layer 5a of the circuit board 5A is extended to the other main surface 5aa via conductor portions 5d such as pins or vias that are formed to be connected to the wiring layer 5b and that run through the insulating layer 5a. Conductor material such as copper or aluminum is used for the pins or vias that function as the conductor portions 5d. A part of the individual conductor portion 5d may be formed to protrude from the insulating layer 5a. The conductor portions 5d extended to the main surface 5aa are electrically and mechanically connected to the individual control electrodes 2c of the plurality of semiconductor elements 2 via the connection portions 5c. The conductor portions 5d and the connection portions 5c or the conductor portions 5d or the connection portions 5c that electrically connect the wiring layer 5b on the main surface 5ab of the circuit board 5A and the control electrodes 2c of the semiconductor elements 2 are examples of conductor connection portions.

The semiconductor device 1A including the circuit board 5A as illustrated in FIG. 3 also achieves the same advantageous effects as those achieved by the above semiconductor device 1.

Figure 4:
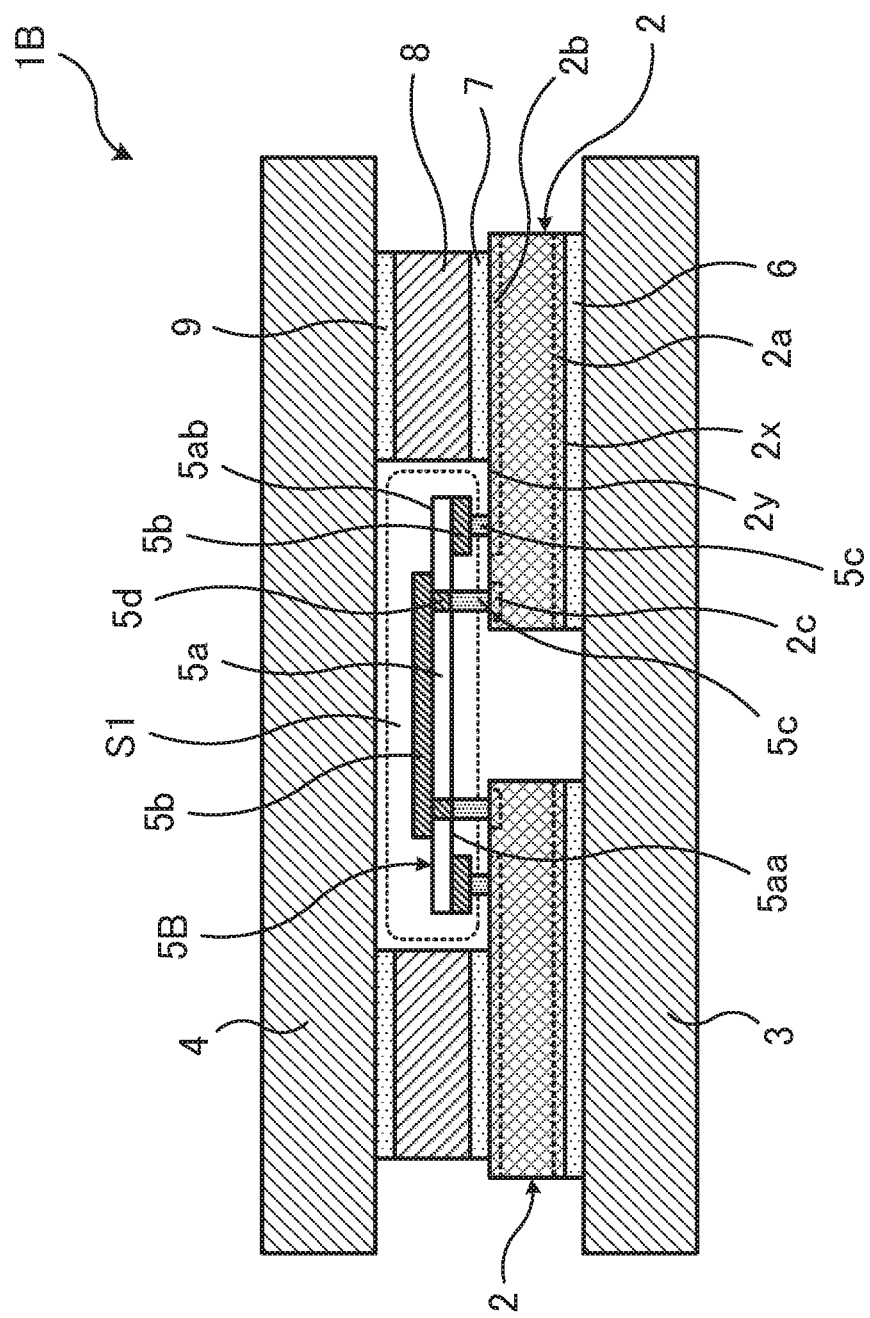
FIG. 4 illustrates a third example of the semiconductor device according to the first embodiment.

FIG. 4 illustrates a third example of the semiconductor device according to the first embodiment. FIG. 4 is a schematic cross section of a main part of an example of the semiconductor device.

This semiconductor device 1B illustrated in FIG. 4 differs from the semiconductor device 1 illustrated in FIG. 1 in that a circuit board 5B is used. Specifically, wiring layers 5b are formed on both of a main surface 5aa of an insulating layer 5a and a main surface 5ab opposite to the main surface 5aa. The circuit board 5B is formed in a space S1 formed between a conductor layer 4 and a plurality of semiconductor elements 2 connected to each other via bonding material 7, conductor blocks 8, and bonding material 9.

The wiring layer 5b arranged on the main surface 5ab of the insulating layer 5a of the circuit board 5B is extended to the other main surface 5aa via conductor portions 5d such as pins, vias, or through holes that are formed to be connected to the wiring layer 5b on the main surface 5ab and that run through the insulating layer 5a. Conductor material such as copper or aluminum is used for the pins, vias, or through holes that function as the conductor portions 5d. A part of the individual conductor portion 5d may be formed to protrude from the insulating layer 5a. The conductor portions 5d extended from the main surface 5ab to the main surface 5aa are separated from the wiring layer 5b formed on the main surface 5aa. The conductor portions 5d extended from the main surface 5ab to the main surface 5aa are electrically and mechanically connected to control electrodes 2c of the plurality of semiconductor elements 2 via connection portions 5c. In addition, the wiring layer 5b formed on the main surface 5aa is electrically and mechanically connected to negative electrodes 2b of the plurality of semiconductor elements 2 via connection portions 5c. The conductor portions 5d and the connection portions 5c or the conductor portions 5d or the connection portions 5c that electrically connect the wiring layer 5b on the main surface 5ab of the circuit board 5A and the control electrodes 2c of the semiconductor elements 2 are examples of conductor connection portions. In addition, the connection portions 5c that electrically connect the wiring layer 5b on the main surface 5aa of the circuit board 5B and the negative electrodes 2b of the semiconductor elements 2 are examples of conductor connection portions.

The wiring layer 5b formed on the main surface 5ab of the insulating layer 5a of the circuit board 5B and the conductor portions 5d and the connection portions 5c connected to the wiring layer 5b form the paths of electrical signals (a voltage and a current at switching control) supplied to the control electrodes 2c of the plurality of semiconductor elements 2. In addition, the wiring layer 5b formed on the main surface 5aa of the insulating layer 5a of the circuit board 5B and the connection portions 5c connected to the wiring layer 5b form the paths of electrical signals (a voltage and a current at switching control) supplied to the negative electrodes 2b of the plurality of semiconductor elements 2. When the semiconductor device 1B is operated, these two paths formed in the circuit board 5B are used, and a switching control voltage is applied across the control electrode 2c and the negative electrode 2b of the individual semiconductor element 2. In addition, a main current voltage is applied across a conductor layer 3 connected to the positive electrodes 2a of the plurality of semiconductor elements 2 and the conductor layer 4 connected to the negative electrodes 2b of the plurality of semiconductor elements 2.

The semiconductor device 1B using the circuit board 5B as illustrated in FIG. 4 also achieves the same advantageous effects as those achieved by the semiconductor device 1.

Next, configuration examples of the circuit board 5B and examples of connection to the semiconductor elements 2 will be described in more detail with reference to FIGS. 5A to 5C and FIGS. 6A to 6C.

FIGS. 5A to 5C and FIGS. 6A to 6C illustrate configuration examples of the circuit board 5B and examples of connection to the semiconductor elements 2 according to the first embodiment. Each of FIGS. 5A to 5C and FIGS. 6A to 6C is a schematic cross section of a main part of the circuit board and a semiconductor element connected thereto.

Figure 5A:
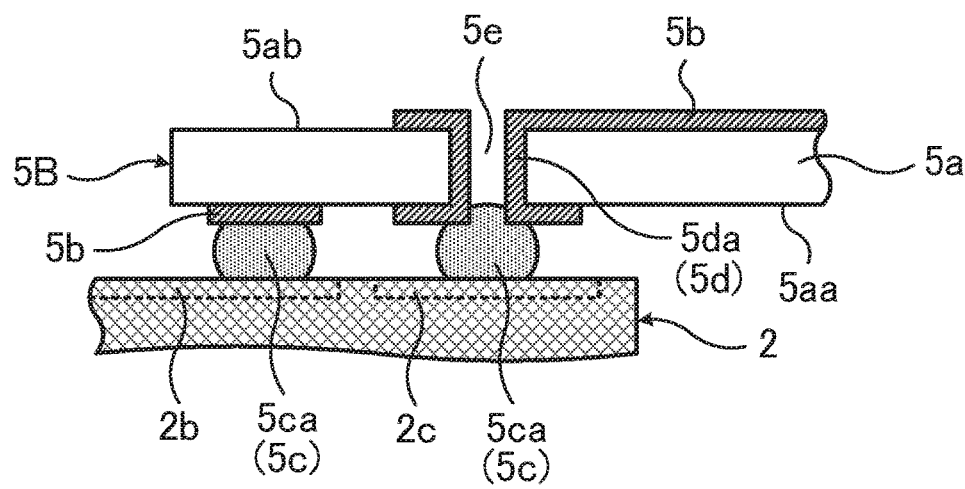
FIGS. 5A to 5C illustrate configuration examples of a circuit board and examples of connection to a semiconductor element according to the first embodiment.

The circuit board 5B includes the insulating layer 5a, the wiring layers 5b formed on the main surface 5ab and the main surface 5aa of the insulating layer 5a, and the individual conductor portions 5d that run through the insulating layer 5a. For example, as illustrated in FIG. 5A, the circuit board 5B includes, as the individual conductor portion 5d, a through hole 5da that is continuously formed on the inner walls of a penetration hole 5e from the wiring layer 5b on the main surface 5ab of the insulating layer 5a. For example, solder bumps 5ca as illustrated in FIG. 5A are used as the connection portions 5c that connect the circuit board 5B and the semiconductor elements 2. The wiring layer 5b formed on the main surface 5ab of the insulating layer 5a is connected to the control electrodes 2c of the semiconductor elements 2 via the through holes 5da (conductor portions 5d) and the solder bumps 5ca (the connection portions 5c) connected thereto. The wiring layer 5b formed on the main surface 5aa of the insulating layer 5a is connected to the negative electrodes 2b of the semiconductor elements 2 via the solder bumps 5ca (the connection portions 5c).

Figure 5B:
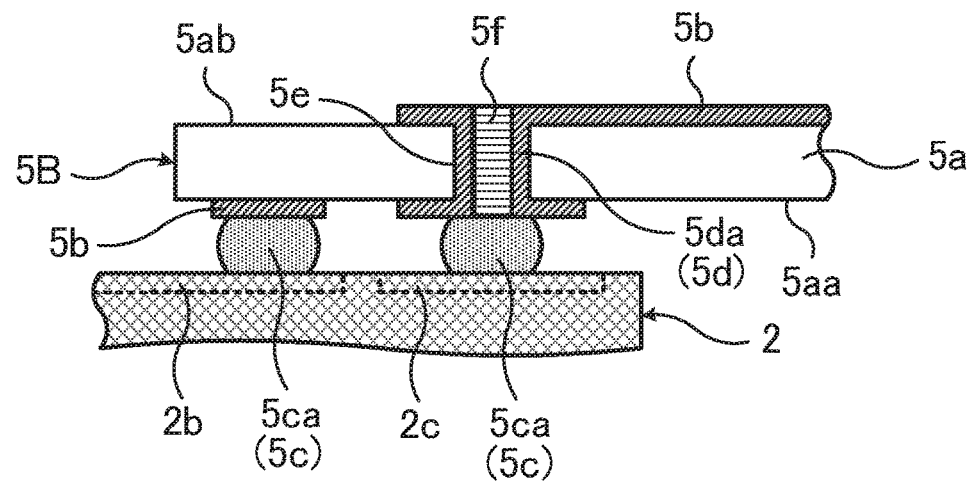

For example, as illustrated in FIG. 5B, the inside of the individual through hole 5da formed in the circuit board 5B may be filled with filling material 5f. Conductor material such as copper or aluminum, resin material such as epoxy resin, or composite material obtained by allowing resin material to contain conductive or insulating filler may be used as the filling material 5f. If the filling material 5f has certain electrical conductivity, the through holes 5da and the filling material 5f function as the conductor portions 5d in the circuit board 5B in FIG. 5B.

Figure 5C:
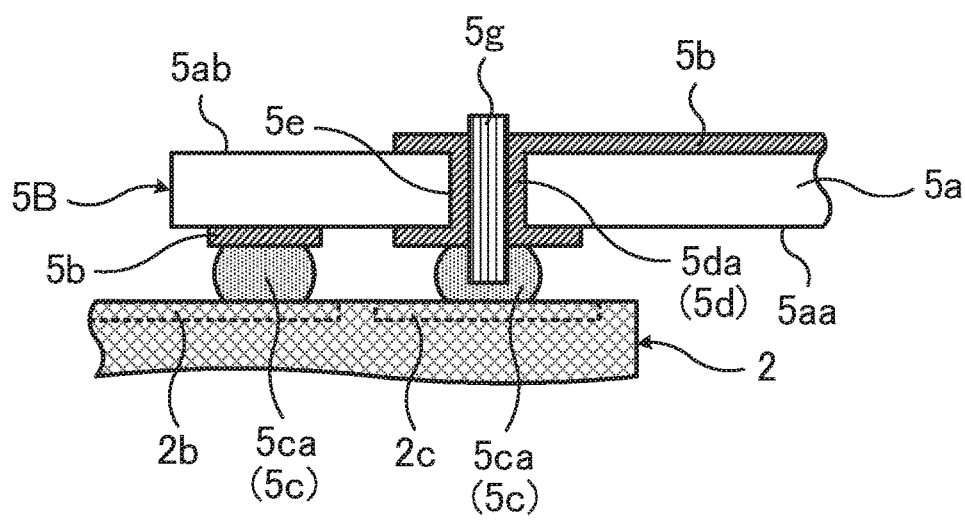

For example, as illustrated in FIG. 5C, a pin 5g may be inserted into the inside of the individual through hole 5da formed in the circuit board 5B. Conductor material such as copper or aluminum may be used for these pins 5g. As illustrated in FIG. 5C, the individual pin 5g may be formed to partially protrude from the insulating layer 5a. The through holes 5da and the pins 5g function as the conductor portions 5d in the circuit board 5B illustrated in FIG. 5C.

Figure 6A:
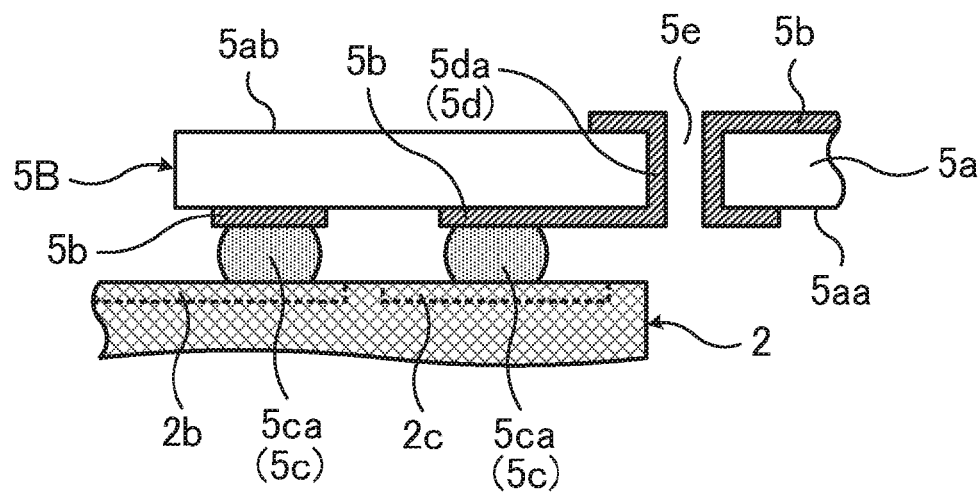
FIGS. 6A to 6C illustrate other configuration examples of the circuit board and other examples of connection to the semiconductor element according to the first embodiment.

The conductor portions 5d of the circuit board 5B, e.g., the above through holes 5da, do not always need to be located immediately above the control electrodes 2c of the semiconductor elements 2. For example, as illustrated in FIG. 6A, the wiring layer 5b of the circuit board 5B may be first extended from the main surface 5ab to the main surface 5aa of the insulating layer 5a via a through hole 5da that is not located immediately above any of the control electrodes 2c and is next extended along the main surface 5aa. The wiring layer 5b extended along the main surface 5aa as described above is connected to the control electrodes 2c of the semiconductor elements 2 via the solder bumps 5ca (a connection portion 5c). The other wiring layer 5b separated from the above wiring layer 5b and formed on the main surface 5aa is connected to the negative electrodes 2b of the semiconductor elements 2 via the solder bumps 5ca (connection portions 5c).

Figure 6B:
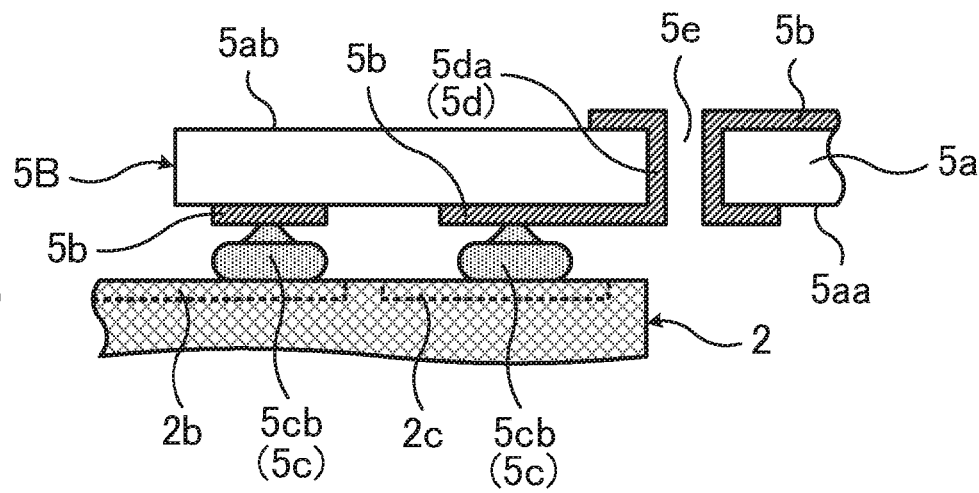

Other than these solder bumps 5ca, for example, stud bumps 5cb made of gold or the like as illustrated in FIG. 6B may be used as the connection portions 5c of the circuit board 5B. For example, a stud bump 5cb is formed on each of the control electrodes 2c and the negative electrodes 2b of the semiconductor elements 2. Some of the stud bumps 5cb are connected to the wiring layer 5b extending from the main surface 5ab to the main surface 5aa of the insulating layer 5a via the through holes 5da. In addition, other stud bumps 5cb are connected to the wiring layer 5b separated from the above wiring layer 5b and formed on the main surface 5aa. Alternatively, the stud bumps 5cb may be formed on the wiring layers 5b of the circuit board 5B.

Figure 6C:
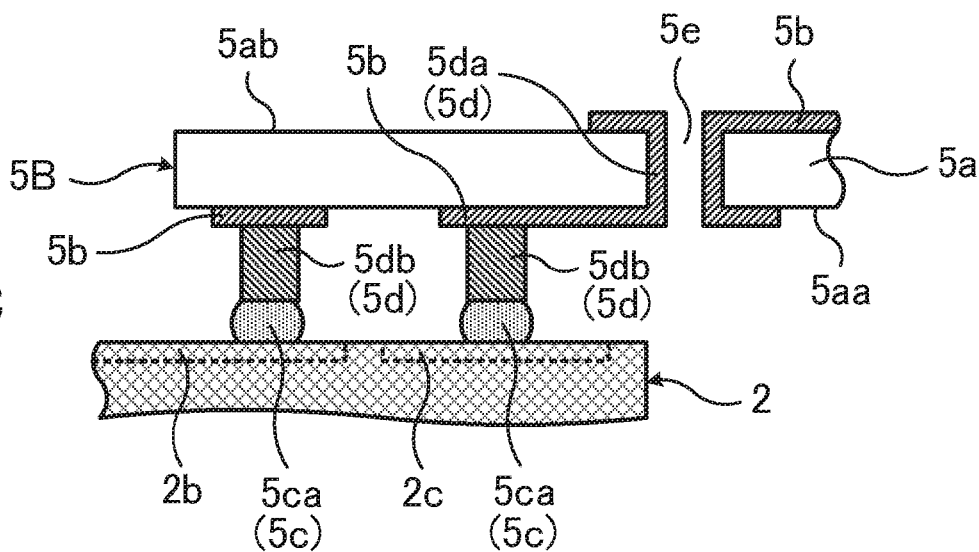

For example, as illustrated in FIG. 6C, pillars 5db of copper or the like may be used for the conductor portions 5d of the circuit board 5B. For example, some pillars 5db are formed on the wiring layer 5b extending from the main surface 5ab to the main surface 5aa of the insulating layer 5a via the through holes 5da. In addition, other pillars 5db are formed on the wiring layer 5b separated from the above wiring layer 5b and formed on the main surface 5aa. These pillars 5db are connected to the control electrodes 2c and the negative electrodes 2b of the semiconductor element 2. Alternatively, these pillars 5db may be formed on the control electrodes 2c and the negative electrodes 2b of the semiconductor elements 2.

In the present example, the wiring layer 5b connected to the control electrodes 2c of the semiconductor elements 2 is formed on the main surface 5ab of the insulating layer 5a of the circuit board 5B, and the wiring layer 5b connected to the negative electrodes 2b of the semiconductor elements 2 is formed on the main surface 5aa of the insulating layer 5a. Alternatively, the wiring layer 5b connected to the negative electrodes 2b of the semiconductor elements 2 may be formed on the main surface 5ab of the insulating layer 5a, and the wiring layer 5b connected to the control electrodes 2c of the semiconductor elements 2 may be formed on the main surface 5aa of the insulating layer 5a.

While the above description has been made on configuration examples of the circuit board 5B and examples of connection to the semiconductor elements 2, the wiring layer 5b formed on the main surface 5aa of the insulating layer 5a of the above circuit board 5 (FIG. 1) and the wiring layer 5b formed on the main surface 5ab of the insulating layer 5a of the above circuit board 5A (FIG. 3) may also be formed and connected to the semiconductor elements 2 in accordance with any one of the examples illustrated in FIGS. 5A to 5C and FIGS. 6A to 6C.

Configuration examples of the wiring layers 5b of the circuit board 5B will be described in more detail with reference to FIG. 7 and FIGS. 8A to 8C.

Figure 7:
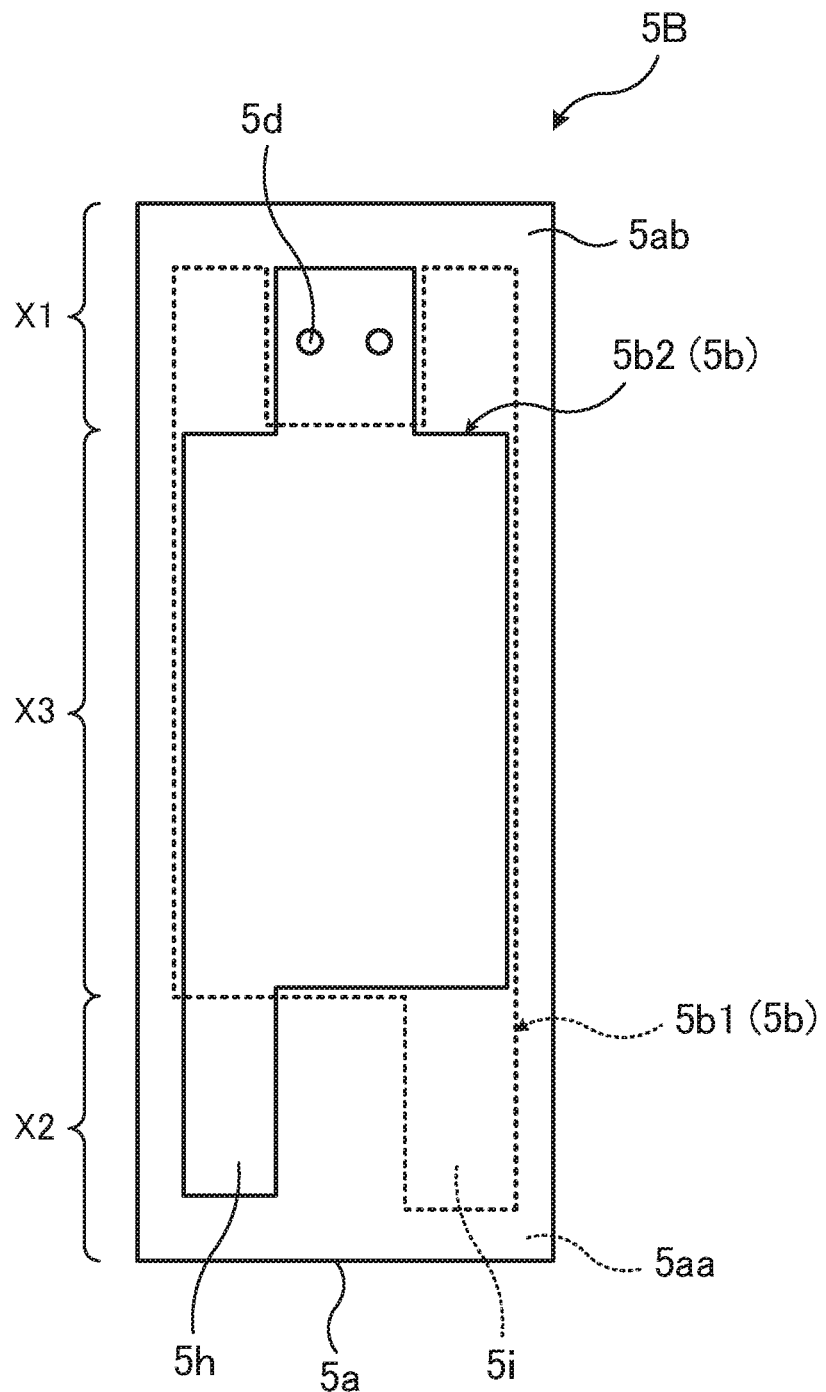
FIG. 7 illustrates a configuration example (a perspective view) of wiring layers of the circuit board according to the first embodiment.
Figure 8A:
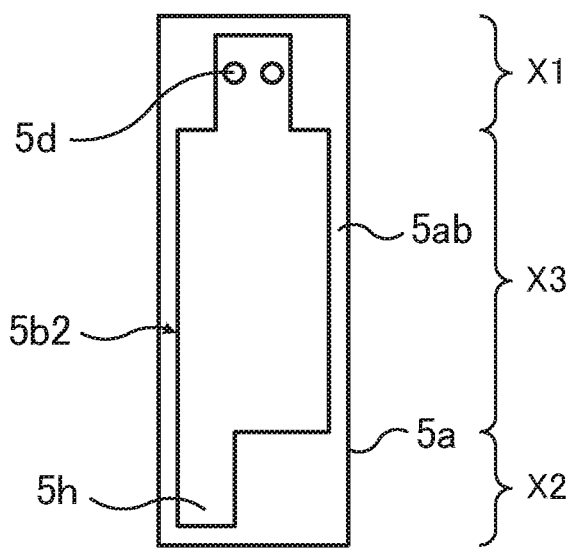
FIGS. 8A to 8C illustrate configuration examples (top, side, and bottom views) of the wiring layers of the circuit board according to the first embodiment.
Figure 8B:
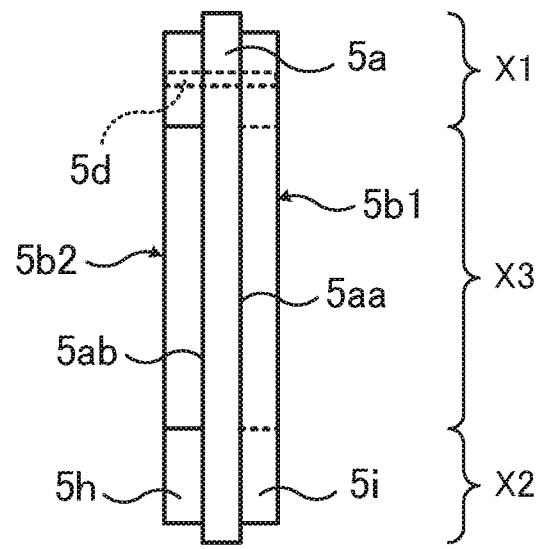
Figure 8C:
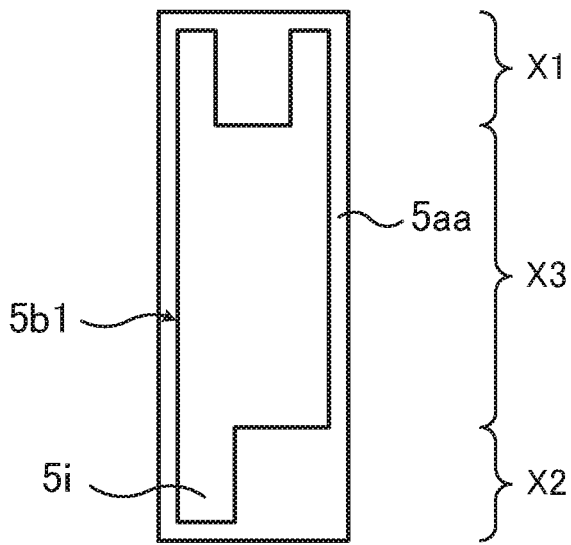

FIG. 7 and FIGS. 8A to 8C illustrate configuration examples of the wiring layers of the circuit board 5B according to the first embodiment. FIG. 7 is a schematic perspective view of a main part of an example of the circuit board 5B. FIG. 8A is a schematic top view of the main part of the example of the circuit board 5B. FIG. 8B is a schematic side view of the main part of the example of the circuit board 5B. FIG. 8C is a schematic bottom view of the main part of the example of the circuit board 5B.

For example, as illustrated in FIG. 7 and FIGS. 8A to 8C, the circuit board 5B includes the insulating layer 5a, the wiring layer 5b formed on the main surface 5ab of the insulating layer 5a, the wiring layer 5b formed on the main surface 5aa of the insulating layer 5a, and the conductor portions 5d formed to run through the insulating layer 5a. In FIG. 7 and FIGS. 8A to 8C, the wiring layer 5b formed on the main surface 5ab of the insulating layer 5a is denoted as "a wiring layer 5b2", and the wiring layer 5b formed on the main surface 5aa of the insulating layer 5a is denoted as "a wiring layer 5b1".

The wiring layer 5b2 formed on the main surface 5ab of the insulating layer 5a has a convex portion at one end portion X1 of the circuit board 5B. This convex portion convexly protrudes from a portion having a certain width (a certain width portion) at an intermediate portion X3 of the circuit board 5B in plan view. For example, the plurality of conductor portions 5d such as the above through holes 5da or pins 5g that run through the insulating layer 5a are connected to the convex portion of the wiring layer 5b2 at the end portion X1. The wiring layer 5b2 formed on the main surface 5ab of the insulating layer 5a has a convex portion at an end portion X2 (the other end portion) of the circuit board 5B. This convex portion convexly protrudes from the certain width portion at the intermediate portion X3 of the circuit board 5B. This convex portion of the wiring layer 5b2 at the end portion X2 is used as an external connection terminal 5h.

The wiring layer 5b1 formed on the main surface 5aa of the insulating layer 5a has a concave portion at the end portion X1 of the circuit board 5B. The concave portion concavely protrudes from the certain width portion at the intermediate portion X3 of the circuit board 5B in plan view. For example, the concave portion of the wiring layer 5b1 at the end portion X1 is formed not to overlap the above convex portion of the wiring layer 5b2 at the end portion X1 in plan view. The wiring layer 5b1 formed on the main surface 5aa of the insulating layer 5a has a convex portion at the other end portion X2 of the circuit board 5B. The convex portion convexly protrudes from the certain width portion at the intermediate portion X3 of the circuit board 5B. The convex portion of the wiring layer 5b1 at the end portion X2 is used as an external connection terminal 5i.

The wiring layer 5b2 formed on the main surface 5ab of the insulating layer 5a and the wiring layer 5b1 formed on the other main surface 5aa of the insulating layer 5a are formed to overlap with each other in plan view at the intermediate portion X3 of the circuit board 5B. The circuit board 5B has a laminated wiring structure in which the wiring layers 5b2 and 5b1 are formed to partially overlap with each other in plan view via the insulating layer 5a.

The circuit board 5B of the semiconductor device 1B (FIG. 4) is formed so that at least one end portion X1 is located in the space S1 formed between the plurality of semiconductor elements 2 and the conductor layer 4 connected to each other via the conductor blocks 8, with the main surfaces 5aa and 5ab of the insulating layer 5a facing the plurality of semiconductor elements 2 and the conductor layer 4, respectively. The plurality of conductor portions 5d connected to the convex portion of the wiring layer 5b2 at the end portion X1 are connected to the control electrodes 2c of the plurality of semiconductor elements 2 via the connection portions 5c such as the above solder bumps 5ca. The concave portion of the wiring layer 5b1 at the end portion X1 is connected to the negative electrodes 2b of the plurality of semiconductor elements 2 via the connection portions 5c such as the above solder bumps 5ca. When the semiconductor device 1B is operated, the switching control voltage is applied across the terminal 5h of the wiring layer 5b2 at the end portion X2 and the terminal 5i of the wiring layer 5b1 at the end portion X2 of the circuit board 5B.

In the case of the circuit board 5B, the wiring layer 5b2 formed on the main surface 5ab of the insulating layer 5a and the conductor portions 5d and the connection portions 5c connected thereto form the paths of electrical signals (a voltage and a current at switching control) supplied to the control electrodes 2c. The wiring layer 5b1 formed on the main surface 5aa of the insulating layer 5a and the connection portions 5c connected thereto form the paths of electrical signals (a voltage and a current at switching control) supplied to the negative electrodes 2b.

In the case of the circuit board 5B, when the switching control voltage is applied to the plurality of semiconductor elements 2, opposite-direction currents flow through the wiring layer 5b2 connected to the control electrodes 2c and the wiring layer 5b1 connected to the negative electrodes 2b. Herein, as described above, the wiring layer 5b2 connected to the control electrodes 2c and the wiring layer 5b1 connected to the negative electrodes 2b overlap with each other in plan view at the intermediate portion X3 of the circuit board 5B. Thus, in the case of the circuit board 5B, the electromagnetic field generated by the current flowing through the wiring layer 5b2 is offset by the electromagnetic field generated by the current flowing through the wiring layer 5b1.

Figure 9A:
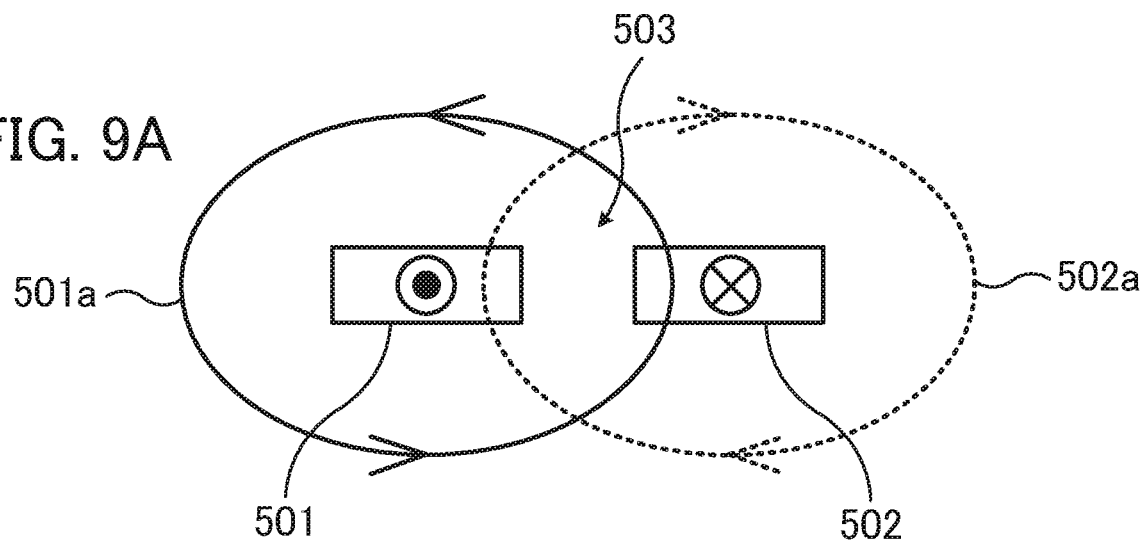
FIGS. 9A and 9B illustrate a relationship between the currents flowing through the wiring layers and the electromagnetic fields formed by the currents.
Figure 9B:
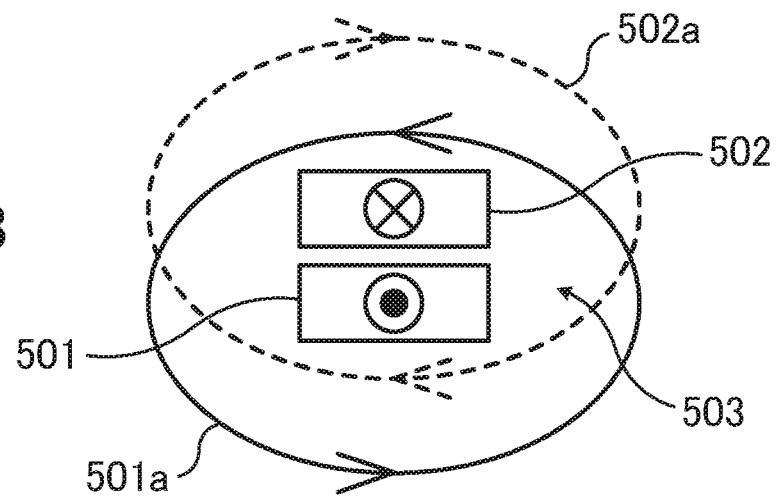

FIGS. 9A and 9B illustrate a relationship between the currents flowing through wiring layers and the electromagnetic fields generated by the currents. FIG. 9A is a schematic cross section of a main part of an example of two wiring layers arranged horizontally side by side, the currents flowing through the two wiring layers, and the electromagnetic field generated by the currents. FIG. 9B is a schematic cross section of a main part of an example of two wiring layers arranged vertically side by side, the currents flowing through the two wiring layers, and the electromagnetic field generated by the currents.

For example, as illustrated in FIG. 9A, when opposite-direction currents flow through these two wiring layers 501 and 502 arranged horizontally side by side, a counter-clockwise electromagnetic field 501a is generated around one wiring layer, and a clockwise electromagnetic field 502a is generated around the other wiring layer. At a portion 503 where the electromagnetic fields 501a and 502a overlap with each other, the electromagnetic fields 501a and 502a are offset by each other. As illustrated in FIG. 9B, when opposite-direction currents flow through the two wiring layers 501 and 502 arranged vertically side by side, too, the counter-clockwise electromagnetic field 501a is generated around one wiring layer, and the clockwise electromagnetic field 502a is generated around the other wiring layer. At a portion 503 where the electromagnetic fields 501a and 502a overlap with each other, the electromagnetic fields 501a and 502a are also offset by each other.

The configuration (FIG. 9B) in which the two wiring layers 501 and 502 are arranged vertically side by side creates the portion 503, which is larger than that created by the configuration (FIG. 9A) in which the two wiring layers 501 and 502 are arranged horizontally side by side. Namely, the configuration (FIG. 9B) achieves a better offset effect between the electromagnetic fields 501a and 502a. Even if the vertical distance between the wiring layers 501 and 502 arranged vertically side by side and the horizontal distance between the wiring layers 501 and 502 arranged horizontally side by side are equal to each other, the configuration in which the wiring layers 501 and 502 are arranged vertically side by side achieves a relatively large offset effect between the electromagnetic fields 501a and 502a.

As illustrated in FIG. 7 and FIGS. 8A to 8C, in the case of the circuit board 5B, the wiring layers 5b2 and 5b1 through which opposite-direction currents flow are arranged vertically side by side and overlap with each other. In this way, since the portion where the electromagnetic fields generated by the opposite-direction currents that flow through the wiring layers 5b2 and 5b1 overlap with each other is relatively enlarged, the electromagnetic fields are effectively offset by each other. By adjusting the material and the thickness of the insulating layer 5a between the wiring layers 5b2 and 5b1, the electromagnetic fields generated by the opposite-direction currents that flow through the wiring layers 5b2 and 5b1 are offset by each other even more effectively. Since the circuit board 5B has a laminated wiring structure in which the wiring layers 5b2 and 5b1 through which the opposite-direction currents flow are arranged vertically side by side and overlap with each other, the electromagnetic fields are effectively offset by each other. Thus, reduction in the inductance is achieved.

As in the case with the above semiconductor device 1, the semiconductor device 1B using the circuit board 5B achieves downsizing. In addition, overheating of the semiconductor elements 2 is reduced, and a larger current is allowed to flow through the semiconductor elements 2. In addition, the impact by the electromagnetic field of the main current on the switching control of the semiconductor elements 2 is reduced, and the paths of the electrical signals for the switching control of the semiconductor elements 2 are allowed to have an equal length. In addition, in the case of the semiconductor device 1B using the circuit board 5B, the electromagnetic fields of the paths of the switching control electrical signals are effectively offset by each other. Use of the circuit board 5B having the above configuration enables the semiconductor device 1B to have a small size and semiconductor elements 2 have excellent operation performance.

Arrangement examples of the above circuit board 5B will be described in more detail with reference to FIGS. 10A and 10B.

Figure 10A:
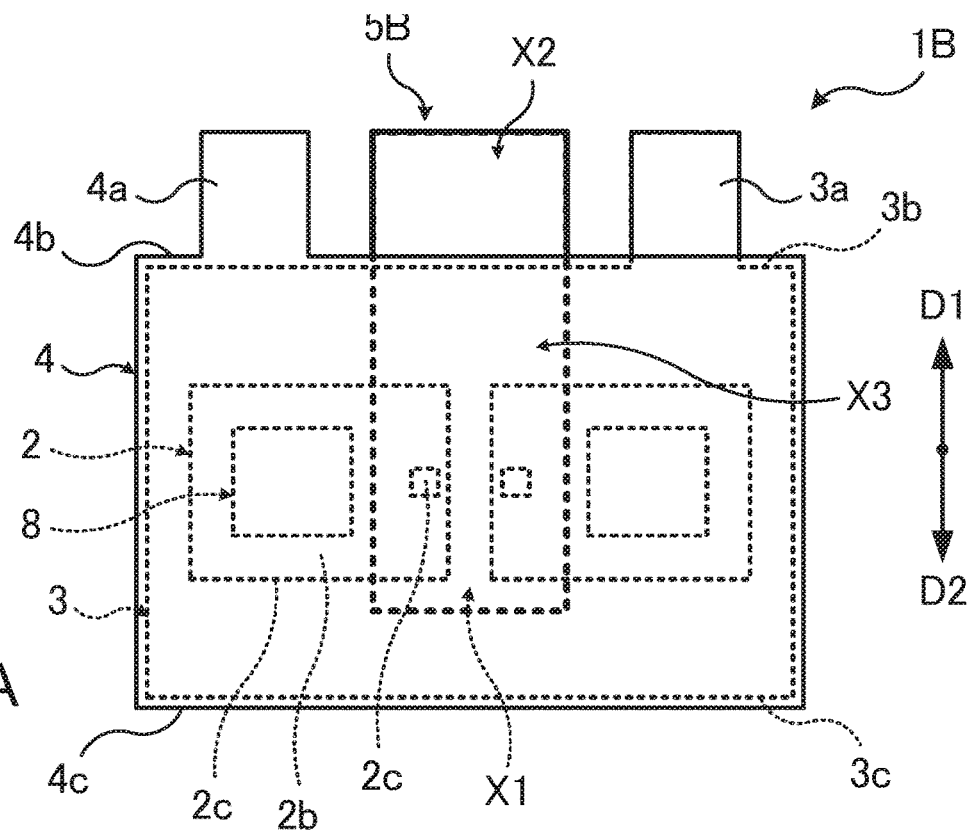
FIGS. 10A and 10B illustrate arrangement examples of the circuit board according to the first embodiment.
Figure 10B:
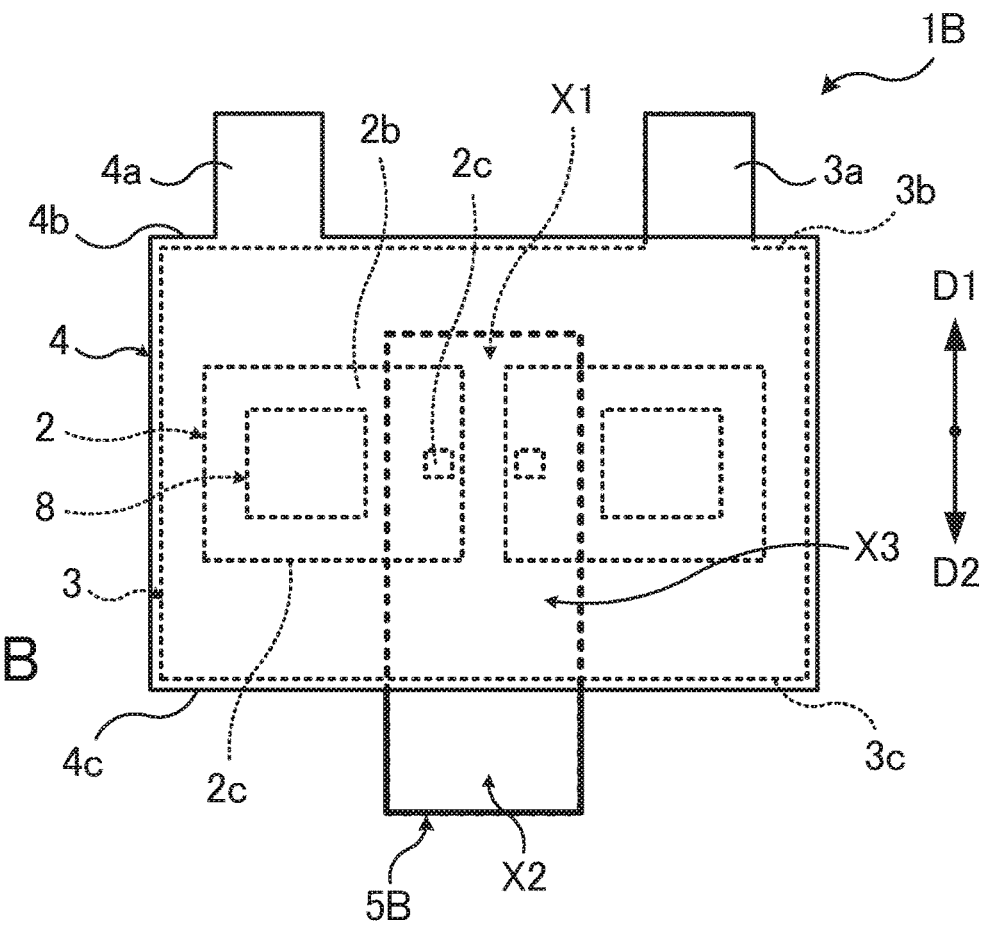

FIGS. 10A and 10B illustrate arrangement examples of the circuit board 5B according to the first embodiment. Each of FIGS. 10A and 10B is a schematic plan view of a main part of an example of the semiconductor device 1B using the circuit board 5B.

For example, the circuit board 5B of the semiconductor device 1B (FIG. 4) is formed so that the end portion X1 is located in the space S1 formed between the plurality of semiconductor elements 2 and the conductor layer 4 connected to each other via the conductor blocks 8, etc., with the main surfaces 5aa and 5ab of the insulating layer 5a facing the plurality of semiconductor elements 2 and the conductor layer 4, respectively. While the end portion X1 is formed as described above, the other end portion X2 of the circuit board 5B is formed outside the conductor layer 4 and the conductor layer 3 opposite thereto in plan view.

For example, as illustrated in FIGS. 10A and 10B, the conductor layer 3, to which the positive electrodes 2a of the plurality of semiconductor elements 2 are electrically connected, is provided with a positive-side main terminal (positive terminal) 3a is formed at an edge portion 3b in a direction D1. For example, as illustrated in FIGS. 10A and 10B, the conductor layer 4, to which the negative electrodes 2b of the plurality of semiconductor elements 2 are electrically connected, is provided with a negative-side main terminal (negative terminal) 4a at an edge portion 4b in the direction D1. In this case, the circuit board 5B may be arranged as illustrated in FIG. 10A or 10B, for example.

In the example in FIG. 10A, the circuit board 5B is formed so that one end portion X1 is located between the plurality of semiconductor elements 2 and the conductor layer 4 connected to each other via the conductor blocks 8, etc. and so that the other end portion X2 is located near the edge portions 3b and 4b in the direction D1 where the positive terminal 3a and the negative terminal 4a of the conductor layer 3 and the conductor layer 4 are formed and on the outer side of the conductor layers 3 and 4. By extending the end portion X2 of the circuit board 5B in the direction D1 in which the positive terminal 3a of the conductor layer 3 and the negative terminal 4a of the conductor layer 4 are formed, downsizing of the semiconductor device 1B is achieved.

In the example in FIG. 10B, the circuit board 5B is formed so that one end portion X1 is located between the plurality of semiconductor elements 2 and the conductor layer 4 connected to each other via the conductor blocks 8, etc. and so that the other end portion X2 is located near edge portions 3c and 4c in the direction D2 opposite to the direction D1 in which the positive terminal 3a and the negative terminal 4a of the conductor layers 3 and 4 are formed and on the outer side of the conductor layers 3 and 4. By extending the end portion X2 of the circuit board 5B in the direction D2 opposite to the direction D1 in which the positive terminal 3a of the conductor layer 3 and the negative terminal 4a of the conductor layer 4 are formed, it is possible to reduce the impact of the electromagnetic field of the main current flowing between the positive terminal 3a and the negative terminal 4a on the voltage applied to the circuit board 5B and the current that flows thereby at the time of switching control.

While arrangement examples of the circuit board 5B of the semiconductor device 1B have thus been described, the arrangement as illustrated in FIG. 10A or 10B may similarly be adopted for the circuit board 5 of the semiconductor device 1 (FIG. 1) and the circuit board 5A of the semiconductor device 1A (FIG. 3).

Second Embodiment

Figure 11:
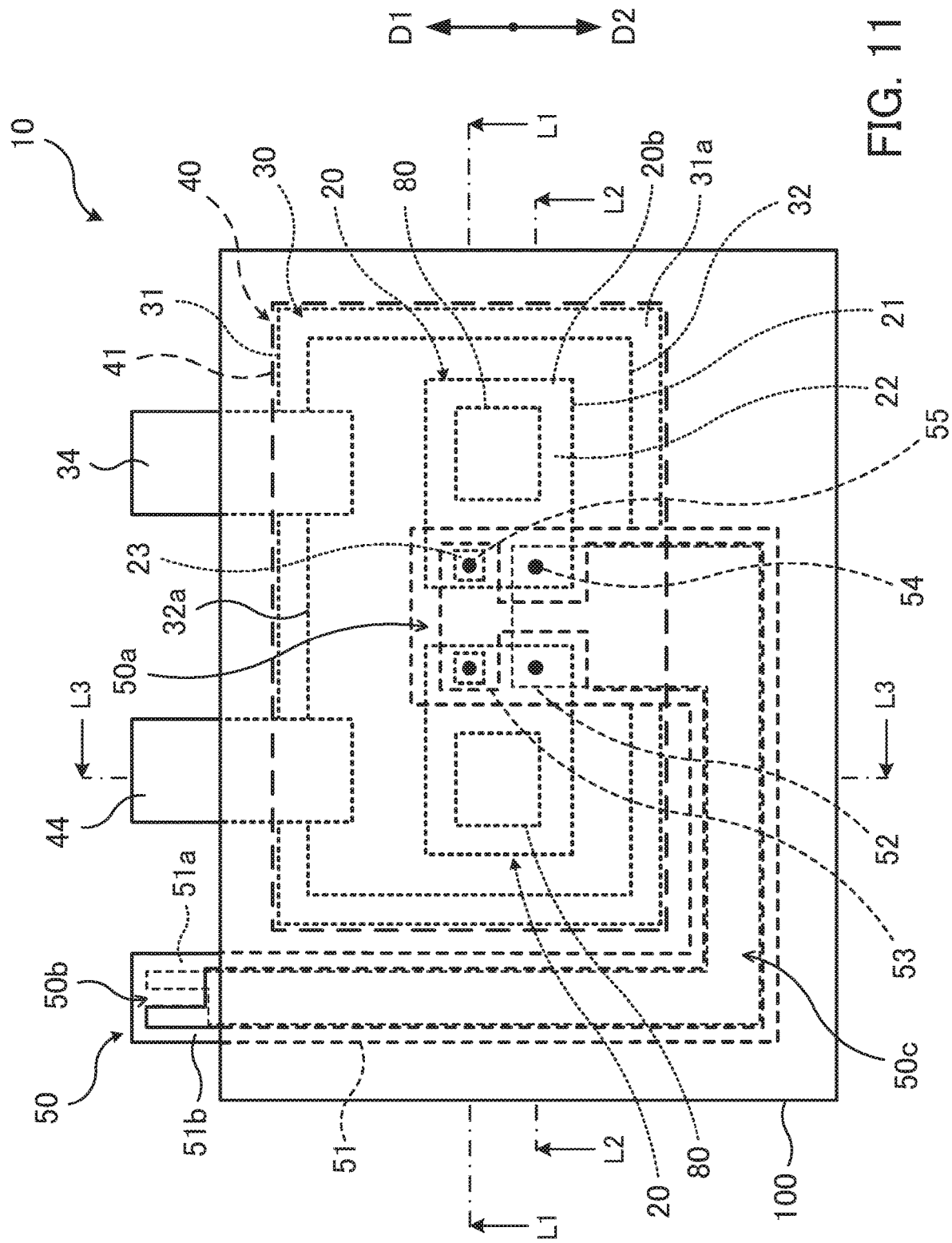
FIG. 11 illustrates an example (a perspective view) of a semiconductor device according to a second embodiment.
Figure 12:
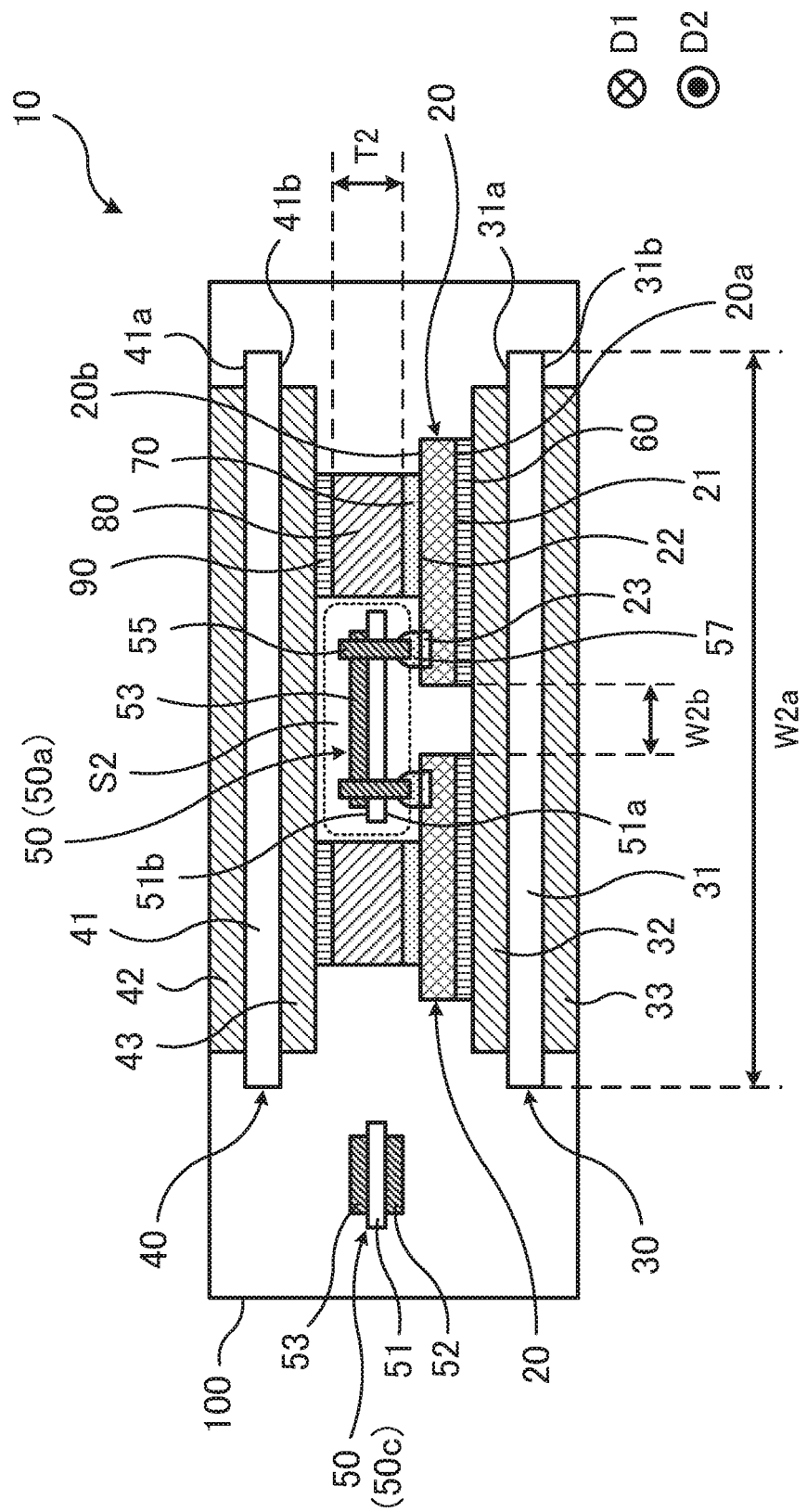
FIG. 12 illustrates an example (a cross section) of the semiconductor device according to the second embodiment.
Figure 13:
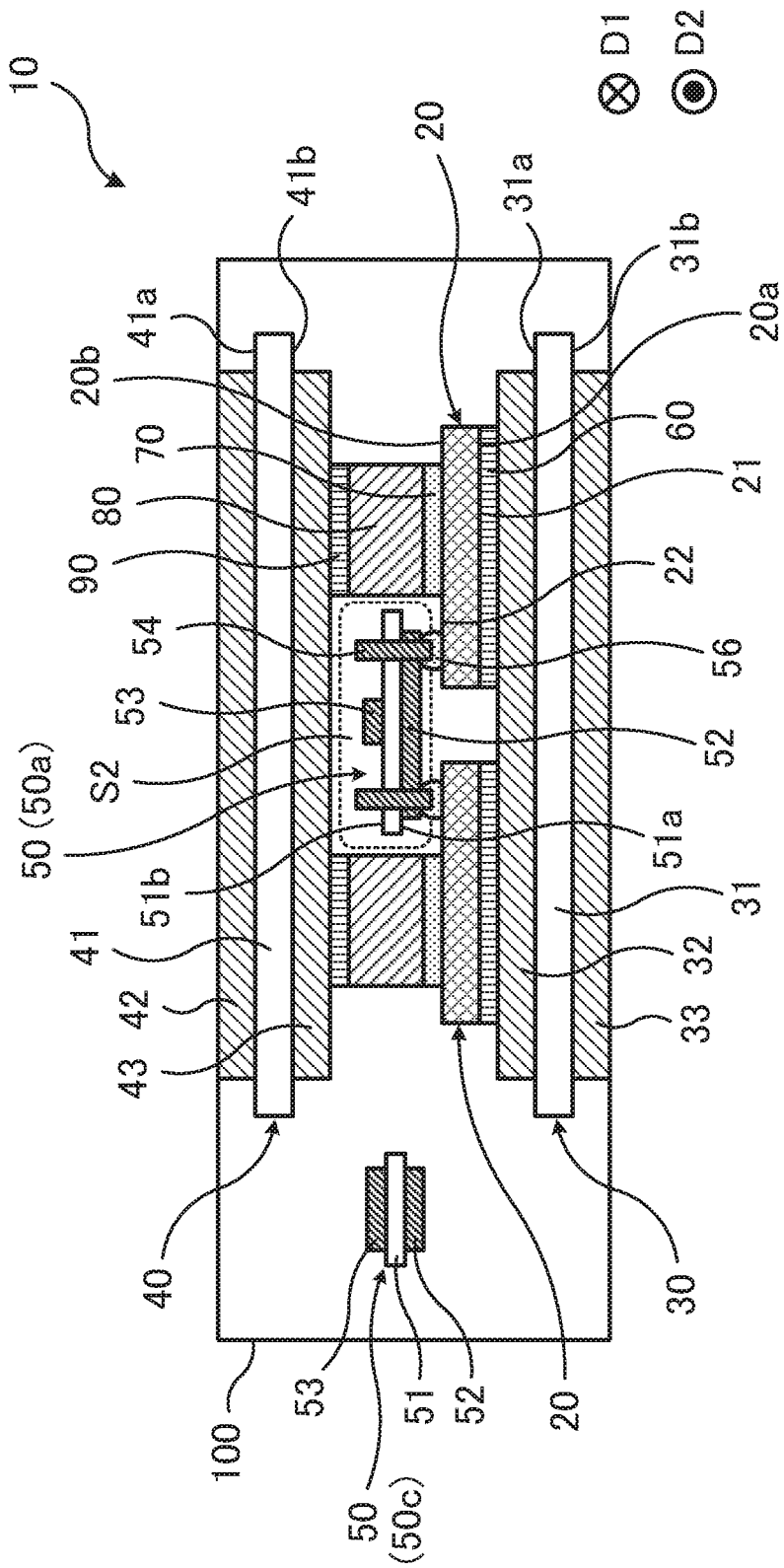
FIG. 13 illustrates an example (another cross section) of the semiconductor device according to the second embodiment.
Figure 14:
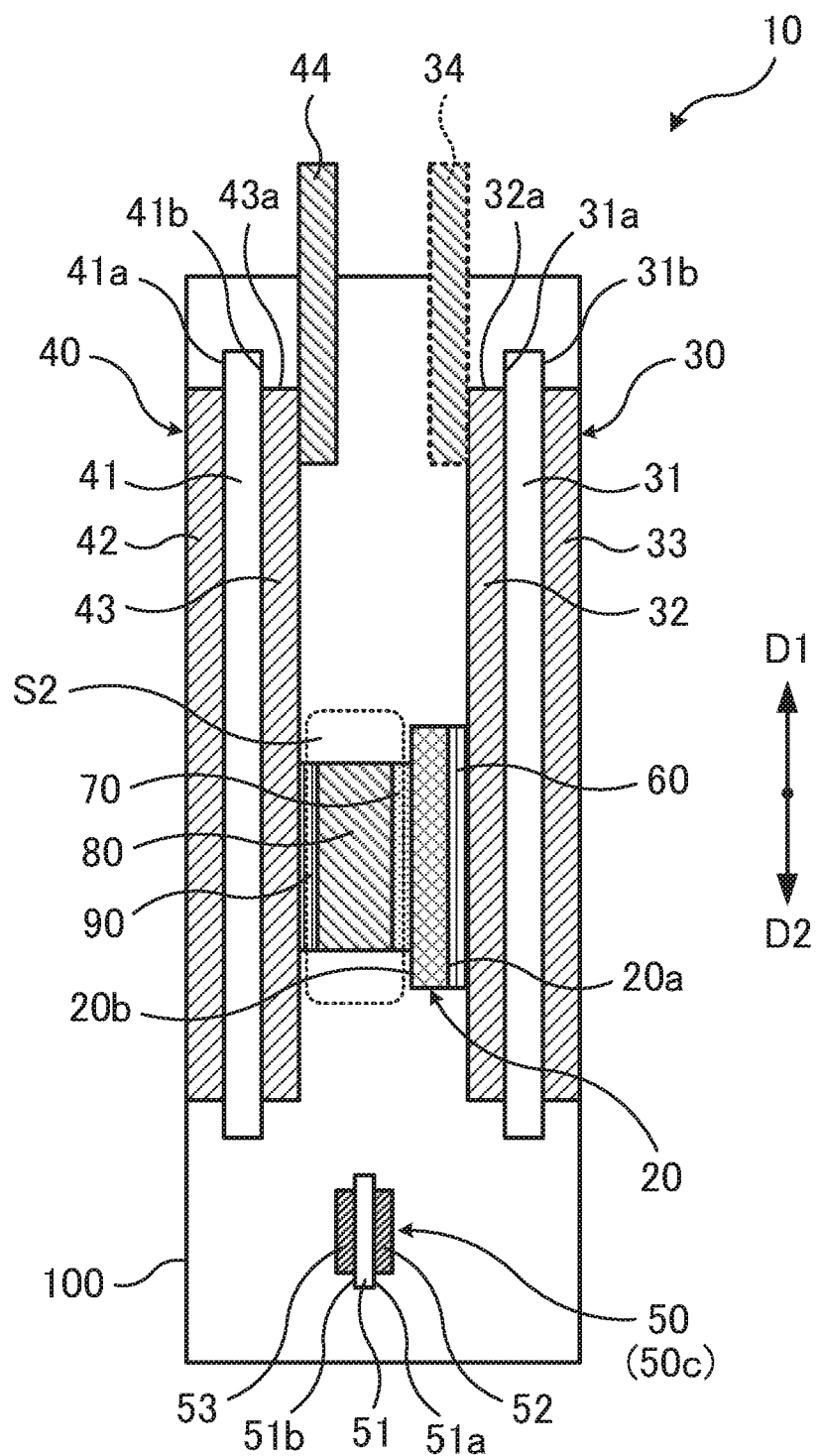
FIG. 14 illustrates an example (another cross section) of the semiconductor device according to the second embodiment.

FIGS. 11 to 14 illustrate an example of a semiconductor device according to a second embodiment. FIG. 11 is a schematic plan view of a main part of an example of a semiconductor device. FIG. 12 is a schematic cross section taken along L1-L1 in FIG. 11. FIG. 13 is a schematic cross section taken along L2-L2 in FIG. 11. FIG. 14 is a schematic cross section taken along L3-L3 in FIG. 11.

This semiconductor device 10 (a semiconductor module) illustrated in FIGS. 11 to 14 includes a plurality of semiconductor elements 20 (in this example, two semiconductor elements 20 in plan view), boards 30 and 40 that face each other via the two semiconductor elements 20, and a circuit board 50 connected to the plurality of semiconductor elements 20.

Various kinds of semiconductor elements (semiconductor chips) may be used as the semiconductor elements 20. For example, semiconductor chips including IGBTs, MOSFETs, power MOSFETs, JFETs, HEMTs, or the like are used as the semiconductor elements 20. Alternatively, RB-IGBTs having reverse voltage properties may be used as the semiconductor elements 20. An RC-IGBT in which an IGBT is connected in reverse parallel to an FWD may be used as an individual semiconductor element 20. An RB-IGBT or an RC-IGBT obtained by including an FWD in a semiconductor chip may be used.

The same kind of or different kinds of semiconductor elements 20 may be used as the plurality of semiconductor elements 20.

Next, an example in which an RC-IGBT including an IGBT and an FWD connected thereto is used as an individual semiconductor element 20 will be described.

As illustrated in FIGS. 11 to 14, the board 30 includes an insulating plate 31, a conductor layer 32 formed on one main surface 31a of the insulating plate 31, and a conductor layer 33 formed on the other main surface 31b of the insulating plate 31. In FIG. 11, for convenience, the conductor layer 33 formed on the other main surface 31b of the insulating plate 31 of the board 30 is not illustrated. The semiconductor elements 20 are formed on the conductor layer 32 of the board 30.

Any one of various kinds of insulating material having certain thermal conductivity may be used for the insulating plate 31. For example, a ceramic board having good thermal conductivity such as aluminum oxide, aluminum nitride, or silicon nitride is used as the insulating plate 31.

Any one of various kinds of conductor material having certain electrical conductivity and thermal conductivity is used for the conductor layer 32. For example, conductor material having good electrical conductivity such as copper or a copper alloy is used for the conductor layer 32. To improve corrosion resistance, a surface treatment layer such as nickel (Ni), a nickel alloy, or gold (Au) may be formed on a surface of the conductor layer 32 formed by using the material as described above.

Any one of various kinds of conductor material having certain thermal conductivity is used for the conductor layer 33. For example, material having good thermal conductivity such as copper, silver, aluminum, iron (Fe), or an alloy containing at least one kind of these elements is used for the conductor layer 33. To improve corrosion resistance, a surface treatment layer such as nickel (Ni) or gold (Au) may be formed on a surface of the conductor layer 33.

For example, the conductor layer 32 having a thickness of 0.2 mm to 1 mm is formed on the board 30. For example, the conductor layer 33 having a thickness of 0.2 mm to 1 mm is formed. The conductor layer 33 having the same thickness as that of the conductor layer 32 is formed. Alternatively, the conductor layer 32 having a different thickness from that of the conductor layer 32 is formed. For example, the insulating plate 31 having a thickness of 0.2 mm to 1 mm that achieves electrical insulation between the conductor layers 32 and 33 is formed.

In addition, as illustrated in FIGS. 11 to 14, the board 40 includes an insulating plate 41, a conductor layer 42 formed on one main surface 41a of the insulating plate 41, and a conductor layer 43 formed on the other main surface 41b of the insulating plate 41. In FIG. 11, for convenience, the conductor layer 42 and 43 formed on the insulating plate 41 of the board 40 are not illustrated. The semiconductor elements 20 are formed on the side of the board 40 where the conductor layer 43 is placed.

Any one of various kinds of insulating material having certain thermal conductivity may be used for the insulating plate 41. For example, a ceramic board having good thermal conductivity such as aluminum oxide, aluminum nitride, or silicon nitride is used as the insulating plate 41.

Any one of various kinds of conductor material having certain thermal conductivity is used for the conductor layer 42. For example, material having good thermal conductivity such as copper, silver, aluminum, iron (Fe), or an alloy containing at least one kind of these elements is used for the conductor layer 42. To improve corrosion resistance, a surface treatment layer such as nickel (Ni) or gold (Au) may be formed on a surface of the conductor layer 42.

Any one of conductor material having certain electrical conductivity and thermal conductivity is used for the conductor layer 43. For example, conductor material having good electrical conductivity such as copper or a copper alloy is used for the conductor layer 43. To improve corrosion resistance, a surface treatment layer such as nickel (Ni) or gold (Au) may be formed on a surface of the conductor layer 43.

For example, the conductor layer 43 having a thickness of 0.2 mm to 1 mm is formed on the board 40. For example, the conductor layer 42 having a thickness of 0.2 mm to 1 mm is formed. The conductor layer 42 having the same thickness as that of the conductor layer 43 is formed. Alternatively, the conductor layer 42 having a different thickness from that of the conductor layer 43 is formed. For example, the insulating plate 41 having a thickness of 0.2 mm to 1 mm that achieves electrical insulation between the conductor layers 43 and 42 is formed.

For example, direct bonding used for a direct copper bonded (DCB) substrate or the like may be used for the bonding among the conductor layers 32 and 33 and the insulating plate 31 of the board 30 and for the bonding of the conductor layers 42 and 43 and the insulating plate 41 of the board 40 illustrated in FIGS. 11 to 14. Alternatively, brazing used for an active metal brazed (AMB) substrate or the like may be used.

As illustrated in FIGS. 11 to 14, each of the two semiconductor elements 20 includes a collector electrode 21 (positive electrode) formed on one main surface 20a and an emitter electrode 22 (negative electrode) and a gate electrode 23 (control electrode) on the other main surface 20b.

The collector electrodes 21 and the emitter electrodes 22 of the two semiconductor elements 20 are formed between the boards 30 and 40 facing each other, the collector electrodes 21 facing in the direction of the board 30 and the emitter electrodes 22 facing in the direction of the board 40. The conductor layer 32 of the board 30 faces the conductor layer 43 of the board 40. The collector electrodes 21 of the two semiconductor elements 20 are electrically and mechanically connected to the conductor layer 32 of the board 30 via bonding material 60. For example, any one of various kinds of bonding material having certain electrical conductivity and thermal conductivity such as sintered material or solder of copper or silver is used as the bonding material 60. The emitter electrodes 22 of the two semiconductor elements 20 are electrically and mechanically connected to the conductor layer 43 of the board 40 via bonding material 70, conductor blocks 80, and bonding material 90. For example, various kinds of bonding material having certain electrical conductivity and thermal conductivity such as sintered material or solder of copper or silver is used as the bonding material 70 and the bonding material 90. For example, any one of various kinds of conductor material having certain electrical conductivity and thermal conductivity such as copper, silver, or aluminum is used for the conductor blocks 80. The individual emitter electrode 22 and the corresponding conductor block 80 are bonded to each other by the bonding material 70, and the individual conductor block 80 and the conductor layer 43 are bonded to each other by the bonding material 90.

The two semiconductor elements 20 generate heat when operated. The heat generated by the plurality of semiconductor elements 20 is transferred to the board 30 via the bonding material 60 and to the board 40 via the bonding material 70, the conductor blocks 80, and the bonding material 90. The individual conductor blocks 80 function as heat spreaders that transfer the heat generated by the two semiconductor elements 20 to the board 40. The conductor blocks 80 also function as spacers for forming a certain space S2 between the two semiconductor elements 20 and the board 40, as illustrated in FIGS. 12 to 14.

The conductor layer 32 of the board 30 connected to the collector electrode 21 of the individual semiconductor element 20 is provided with a positive terminal 34, as illustrated in FIGS. 11 and 14. The positive terminal 34 is schematically indicated by a dotted line in FIG. 14 for convenience. For example, any one of various kinds of conductor material having certain electrical conductivity such as copper or a copper alloy is used for the positive terminal 34. The positive terminal 34 is formed on an edge portion 32a of the conductor layer 32 in the direction D1. For example, the positive terminal 34 is electrically and mechanically connected to the conductor layer 32 by bonding material or ultrasonic bonding. When bonding material is used to bond the positive terminal 34 to the conductor layer 32, any one of various kinds of bonding material having certain electrical conductivity such as sintered material or solder of copper or silver is used.

The conductor layer 43 of the board 40 connected to the emitter electrode 22 of the individual semiconductor element 20 is provided with a negative terminal 44, as illustrated in FIGS. 11 and 14. For example, any one of various kinds of conductor material having certain electrical conductivity such as copper or a copper alloy is used for the negative terminal 44. The negative terminal 44 is formed on an edge portion 43a of the conductor layer 43 in the direction D1. For example, the negative terminal 44 is electrically and mechanically connected to the conductor layer 43 by bonding material or ultrasonic bonding. When bonding material is used to bond the negative terminal 44 to the conductor layer 43, any one of various kinds of bonding material having certain electrical conductivity such as sintered material or solder of copper or silver is used.

As illustrated in FIGS. 11 to 14, the circuit board 50 is formed in the space S2 (FIGS. 12 to 14) formed between the conductor layer 43 of the board 40 and the two semiconductor elements 20 connected to each other via the conductor blocks 80 (and the bonding material 70 and the bonding material 90). The circuit board 50 is formed so that one end portion 50a is located in the space S2 formed between the board 40 and the two semiconductor elements 20 and so that the other end portion 50b and an intermediate portion 50c between the end portions 50a and 50b are located outside the boards 30 and 40. The intermediate portion 50c and the end portion 50b that extend from the end portion 50a located in the space S2 formed between the board 40 and the two semiconductor elements 20 are formed to extend in an L-shape along the periphery of the boards 30 and 40 in plan view as illustrated in FIG. 11. The end portion 50b is formed to protrude from the periphery in the direction D1 in which the positive terminal 34 and the negative terminal 44 of the boards 30 and 40 are formed.

As illustrated in FIGS. 11 to 14, the circuit board 50 includes an insulating layer 51, a wiring layer 52 formed on a main surface 51a of the insulating layer 51, and a wiring layer 53 formed on a main surface 51b of the insulating layer 51. The circuit board 50 is an example of a circuit board having a laminated wiring structure including the insulating layer 51 and the wiring layers 52 and 53 formed thereon.

As illustrated in FIGS. 11 and 12, the circuit board 50 also includes conductor portions 55 that are connected to the wiring layer 53 formed on the main surface 51b of the insulating layer 51 and that run through the insulating layer 51. In FIGS. 11 and 12, pins are illustrated as examples of the conductor portions 55. The wiring layer 53 formed on the main surface 51b is extended to the other main surface 51a by the conductor portions 55. The conductor portions 55 are separated from the wiring layer 52 formed on the main surface 51a of the insulating layer 51. In addition, as illustrated in FIGS. 11 and 13, the circuit board 50 may include conductor portions 54 that are connected to the wiring layer 52 formed on the main surface 51a of the insulating layer 51 and that run through the insulating layer 51. In FIGS. 11 and 13, pins are illustrated as examples of the conductor portions 54. The conductor portions 54 are separated from the wiring layer 53 formed on the main surface 51b of the insulating layer 51.

Any one of various kinds of conductor material is used for the insulating layer 51. For example, inorganic insulating material such as aluminum oxide, aluminum nitride, silicon nitride, or silica or organic insulating material such as epoxy resin, phenol resin, or polyimide resin is used for the insulating layer 51. Fiber or cloth such as insulating filler or glass may be contained in the organic insulating material. Various kinds of conductor material is used for the wiring layers 53 and 52. For example, conductor material such as copper or a copper alloy is used for the wiring layers 53 and 52. Various kinds of conductor material is used for the wiring layers 53 and 52 and the conductor portions 55 and 54 connected thereto. For example, conductor material such as copper or a copper alloy is used for the conductor portions 55 and 54.

The conductor portions 55 connected to the wiring layer 53 formed on the main surface 51b of the insulating layer 51 of the circuit board 50 are electrically and mechanically connected to the gate electrodes 23 of the two semiconductor elements 20, for example, via connection portions 57 such as solder bumps. The conductor portions 54 connected to the wiring layer 52 formed on the main surface 51a of the insulating layer 51 of the circuit board 50 are electrically and mechanically connected to the emitter electrodes 22 of the two semiconductor elements 20, for example, via connection portions 56 such as solder bumps. The conductor portions 55 and the connection portions 57 or the conductor portions 55 or the connection portions 57 that electrically connect the wiring layer 53 formed on the main surface 51b of the circuit board 50 and the gate electrodes 23 of the semiconductor elements 20 are examples of conductor connection portions. In addition, the conductor portions 54 and the connection portions 56 or the conductor portions 54 or the connection portions 56 that electrically connect the wiring layer 52 formed on the main surface 51a of the circuit board 50 and the emitter electrodes 22 of the semiconductor elements 20 are examples of conductor connection portions.

The wiring layer 53 formed on the main surface 51b of the insulating layer 51 of the circuit board 50 and the conductor portions 55 and the connection portions 57 connected to the wiring layer 53 form the paths of electrical signals supplied to the gate electrodes 23 of the two semiconductor elements 20. In addition, the wiring layer 52 formed on the main surface 51a of the insulating layer 51 of the circuit board 50 and the conductor portions 54 and the connection portions 56 connected to the wiring layer 52 form the paths of electrical signals supplied to the emitter electrodes 22 of the two semiconductor elements 20.

A total thickness of the circuit board 50 including the insulating layer 51 and the wiring layers 53 and 52 may be 0.5 mm or less, for example. The space S2 (the thickness, the height, or the gap) in which the circuit board 50 having the above thickness is formed and which is located between the board 40 and the two semiconductor elements 20 may have 1 mm or less, for example. In addition, the width and the thickness of the wiring layers 53 and 52 of the circuit board 50 may be set based on the resistance and the inductance of their conductor material or the size of the current flowing through the wiring layers 53 and 52, for example. In addition, the insulation distance between portions of the wiring layers 53 and 52 of the circuit board 50, the portions extending in an L shape along the periphery of the boards 30 and 40 in plan view at the intermediate portion 50c and the end portion 50b, may be set based on the voltage applied to these conductor portions. In addition, the insulation distance between the conductor layer 32 of the board 30 and the conductor layer 43 of the board 40 may be set based on the voltage applied to these conductor portions.

In addition, as illustrated in FIGS. 11 to 14, the semiconductor device 10 includes resin 100 that seals the semiconductor elements 20, etc. formed between the boards 30 and 40. The conductor layer 33 of the board 30, the conductor layer 42 of the board 40, a part of the positive terminal, a part of the negative terminal 44, and the end portion 50b of the circuit board 50 are exposed to the outside in the resin 100. The structure part other than the above components, namely, the structure part including the semiconductor elements 20, etc. formed between the boards 30 and 40, is sealed by the resin 100. For example, thermoset resin such as epoxy resin, phenol resin, maleimide resin, maleimide modified epoxy resin, or maleimide modified phenol resin is used for the resin 100. Material having certain thermal conductivity and insulation properties may be contained in the resin 100. For example, filler in which material such as aluminum oxide, aluminum nitride, or silicon nitride is used may be contained in the resin 100. Alternatively, fiber or cloth in which material such as glass is used may be contained in the resin 100.

In the case of the semiconductor device 10 having the above configuration, when an RC-IGBT including an IGBT and an FWD connected thereto is used as the individual semiconductor element 20, the same circuit as illustrated in the above FIG. 2 is formed. That is, in the case of the semiconductor device 10, the collector electrode C (collector electrode 21) of the IGBT included in each of the two semiconductor elements 20 and the cathode electrode of the FWD are connected to each other, and the emitter electrode E (emitter electrode 22) of the IGBT and the anode electrode A of the FWD are connected to each other. The collector electrode C is electrically connected to the positive terminal (positive terminal 34), and the emitter electrode E is electrically connected to the negative terminal (negative terminal 44). The gate electrode G (gate electrode 23) is electrically connected to one of the control terminals (one of the paths of the electrical signals of the circuit board 50), and the emitter electrode E (emitter electrode 22) is electrically connected to one of the control terminals (one of the paths of the electrical signals of the circuit board 50).

For example, the semiconductor device 10 may have a circuit configuration in which two RC-IGBT as the two semiconductor elements 20 are connected in parallel to each other.

When the semiconductor device 10 is operated, a switching control voltage for controlling ON and OFF states of the two semiconductor elements 20 is applied across the gate electrode 23 (the gate electrode G) and the emitter electrode 22 (the emitter electrode E) of the individual one of the two semiconductor elements 20 via the wiring layers 53 and 52 of the circuit board 50. In addition, a main current voltage for causing a main current to flow from the collector electrode 21 to the emitter electrode 22 of the individual one of the two semiconductor elements 20 is applied across the positive terminal 34 connected to the collector electrode 21 (the collector electrode C) of the individual one of the two semiconductor elements 20 via the conductor layer 32, etc. and the negative terminal 44 connected to the emitter electrode 22 (the emitter electrode E) via the conductor layer 43, etc.

A predetermined ON voltage is applied when the semiconductor elements 20 are switched from OFF to ON. In this operation, a current for charging the gates flows through the gate electrodes 23 from the wiring layer 53 of the circuit board 50, and a current flows through the wiring layer 52 of the circuit board 50 from the emitter electrode 22. As a result, the semiconductor elements 20 are set to the ON state, and a current flows through the collector electrodes 21 of the two semiconductor elements from the positive terminal 34 via the conductor layer 32, etc. In addition, a current flows through the negative terminal 44 from the emitter electrodes 22 of the two semiconductor elements 20 via the conductor layer 43, etc.

A predetermined OFF voltage lower than the ON voltage is applied when the semiconductor elements 20 are switched from ON to OFF. In this operation, a current for discharging the gates flows through the wiring layer 53 of the circuit board 50 from the gate electrodes 23, and a current flows through the emitter electrodes 22 from the wiring layer 52 of the circuit board 50. As a result, the semiconductor elements 20 are set to the OFF state, and the current flowing through the collector electrodes 21 of the two semiconductor elements 20 from the positive terminal 34 is stopped. In addition, the current flowing through the negative terminal 44 from the emitter electrodes 22 of the two semiconductor elements 20 is also stopped.

A configuration example of the wiring layers 53 and 52 of the circuit board 50 will be described in more detail with reference to FIGS. 15A to 15C.

Figure 15A:
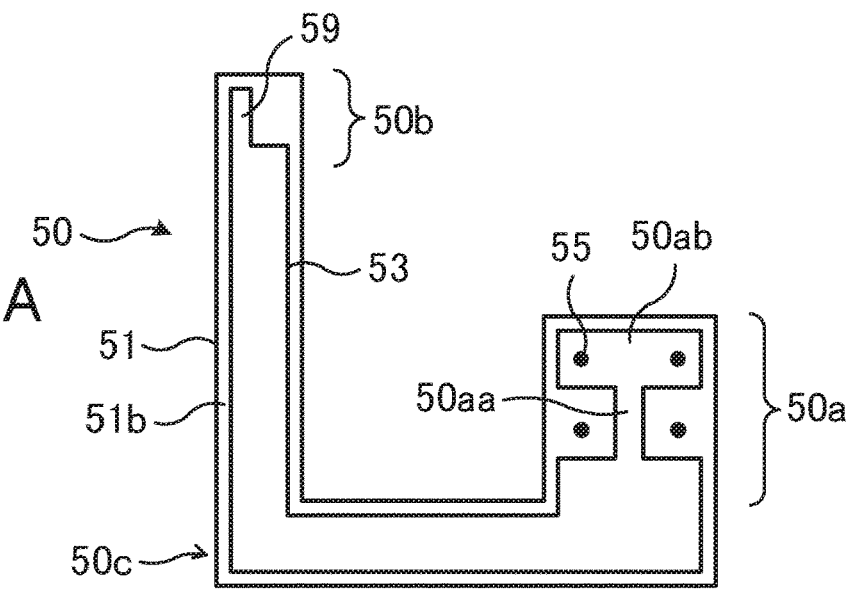
FIGS. 15A to 15C illustrate an example of a circuit board according to the second embodiment.
Figure 15B:
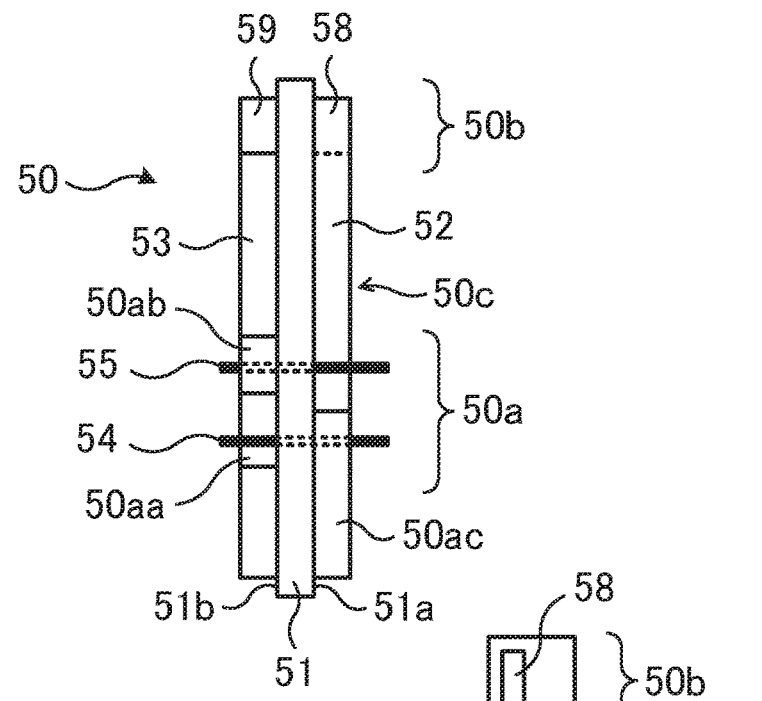
Figure 15C:
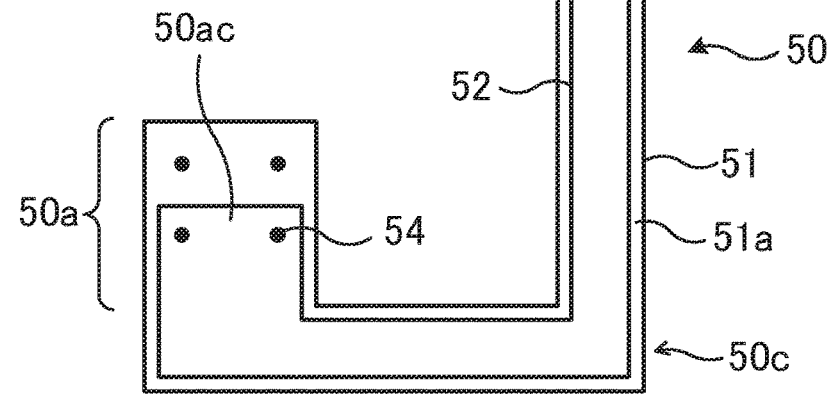

FIGS. 15A to 15C illustrate an example of the circuit board according to the second embodiment. FIG. 15A is a schematic top view of a main part of an example of the circuit board, and FIG. 15B is a schematic side view of the main part of the example of the circuit board. FIG. 15C is a schematic bottom view of the main part of the example of the circuit board.

As illustrated in FIG. 15A, the wiring layer 53 formed on the main surface 51b of the insulating layer 51 of the circuit board 50 has a narrow width portion 50aa having a narrow width and a wide width portion 50ab having a wide width in plan view at the end portion 50a of the circuit board 50. As illustrated in FIGS. 15A and 15B, a plurality of conductor portions 55, two pins in this example, are connected to the wide width portion 50ab of the wiring layer 53 at the end portion 50a. The individual conductor portion 55 is connected to the wiring layer 53 on the main surface 51b, runs through the insulating layer 51, and is separated from the wiring layer 52 on the main surface 51a, as illustrated in FIGS. 15A to 15C. In addition, the wiring layer 53 formed on the main surface 51b of the insulating layer 51 has a convex portion at the end portion 50b of the circuit board 50 as illustrated in FIGS. 15A to 15C. This convex portion convexly protrudes from the certain width portion of the intermediate portion 50c of the circuit board 50. This convex portion of the wiring layer 53 at the end portion 50b is used as an external connection terminal 59.

As illustrated in FIG. 15C, the wiring layer 52 formed on the main surface 51a of the insulating layer 51 of the circuit board 50 has a certain width portion 50ac in plan view at the end portion 50a of the circuit board 50. The certain width portion 50ac of the wiring layer 52 at the end portion 50a does not overlap the wide width portion 50ab of the wiring layer 53 at the end portion 50a in plan view. As illustrated in FIGS. 15B to 15C, a plurality of conductor portions 54, two pins in this example, are connected to the certain width portion 50ac of the wiring layer 52. As illustrated in FIGS. 15A to 15C, the individual conductor portion 54 is connected to the wiring layer 52 of the main surface 51a, runs through the insulating layer 51, and is separated from the wiring layer 53 on the main surface 51b. In addition, the wiring layer 52 formed on the main surface 51a of the insulating layer 51 has a convex portion at the end portion 50b of the circuit board 50, as illustrated in FIGS. 15A to 15C. This convex portion convexly protrudes from the certain width portion at the intermediate portion 50c of the circuit board 50. This convex portion of the wiring layer 52 at the end portion 50b is used as an external connection terminal 58.

The wiring layer 53 formed on the main surface 51b of the insulating layer 51 of the circuit board 50 overlaps the wiring layer 52 formed on the main surface 51a of the insulating layer 51 at the intermediate portion 50c of the circuit board 50 in plan view. The circuit board 50 has a laminated wiring structure in which the wiring layers 53 and 52 partially overlap in plan view via the insulating layer 51.

The semiconductor device 10 is formed so that the end portion 50a of the circuit board 50 is located in the space S2 that is formed between the two semiconductor elements 20 and the conductor layer 43 connected to each other via the conductor blocks 80, with the main surface 51a of the insulating layer 51 facing the two semiconductor elements 20 and the main surface 51b facing the conductor layer 43 of the board 40. The two conductor portions 55 connected to the wide width portion 50ab of the wiring layer 53 at the end portion 50a are connected to the gate electrodes 23 of the two semiconductor elements 20 via the connection portions 57 such as solder bumps. The two conductor portions 54 connected to the certain width portion 50ac of the wiring layer 52 at the end portion 50a are connected to the emitter electrodes 22 of the two semiconductor elements 20 via the connection portions 56 such as solder bumps. When the semiconductor device 10 is operated, a switching control voltage is applied across the terminal 59 of the wiring layer 53 and the terminal 58 of the wiring layer 52 at the end portion 50b of the circuit board 50.

The wiring layer 53 formed on the main surface 51b of the insulating layer 51 of the circuit board 50 and the conductor portions 55 and the connection portions 57 connected to the wiring layer 53 form the paths of electrical signals supplied to the gate electrodes 23 of the two semiconductor elements 20. In addition, the wiring layer 52 formed on the main surface 51a of the insulating layer 51 of the circuit board 50 and the conductor portions 54 and the connection portions 56 connected to the wiring layer 52 form the paths of electrical signals supplied to the emitter electrodes 22 as sensing electrodes of the two semiconductor elements 20. When the semiconductor device 10 is operated, these two paths are used, and a switching control voltage is applied across the gate electrode 23 and the emitter electrode 22 of the individual semiconductor element 20.

In the case of the circuit board 50, when the switching control voltage is applied to the two semiconductor elements 20, opposite-direction currents flow through the wiring layer 53 connected to the gate electrodes 23 and the wiring layer 52 connected to the emitter electrodes 22. Herein, as described above, the wiring layer 53 connected to the gate electrodes 23 and the wiring layer 52 connected to the emitter electrodes 22 overlap with each other in plan view at the intermediate portion 50c of the circuit board 50. Thus, in the case of the circuit board 50, the electromagnetic field generated by the current flowing through the wiring layer 53 is offset by the electromagnetic field generated by the current flowing through the wiring layer 52. Thus, the inductance is reduced. Since the inductance is reduced, oscillation is reduced, and controllability of the two semiconductor elements 20 is improved.

In the case of the semiconductor device 10, the switching control voltage is applied across the gate electrode 23 and the emitter electrode 22 of the individual semiconductor element 20 via the circuit board 50, and the main current voltage is applied to the emitter electrode 22 via the conductor layer 43, the bonding material 90, the conductor blocks 80, and the bonding material 70. As described above, in the case of the semiconductor device 10, since the paths of the switching control electrical signals (a voltage that is applied and a current that consequently flows) supplied to the gate electrode 23 and the emitter electrode 22 of the individual semiconductor element 20 are separated from the paths of the main current electrical signals (a voltage that is applied and a main current that consequently flows) supplied to the emitter electrode 22, the electrical signals that flow through the paths connected to the gate electrode 23 and the emitter electrode 22 of the individual semiconductor element 20 are less affected by the impact of the electromagnetic field generated by the main current that flows through the paths connected to the emitter electrode 22 of the individual semiconductor element 20. Since the impact of the electromagnetic field is reduced, the controllability of the operation of the semiconductor elements 20 is improved.

In addition, in the case of the semiconductor device 10, main current flows between the positive terminal 34 of the conductor layer 32 of the board 30 formed in the direction D1 and the negative terminal 44 of the conductor layer 43 of the board 40 in the direction D1 via the two semiconductor elements 20. The circuit board 50 is extended to the outside of the conductor layers 32 and 43 in the direction opposite to the direction of the main current that flows as described above. That is, the circuit board 50 is extended in the direction D2 and is further extended along the periphery of the conductor layers 32 and 43. The end portion 50b, at which the external connection terminals 59 and 58 are formed, is formed on the same side as the positive terminal 34 and the negative terminal 44 through which the main current flows.

In this way, in the case of the semiconductor device 10, the voltage applied to the circuit board 50 and the current that consequently flows at switching control are less affected by the electromagnetic field generated by the main current that flows between the conductor layer 32 provided with the positive terminal 34 and the conductor layer 43 provided with the negative terminal 44. Since the impact of the electromagnetic field is reduced, the controllability of the operation of the semiconductor elements 20 is improved. In addition, the circuit board 50 of the semiconductor device 10 is extended to the outside of the conductor layers 32 and 43 along the periphery of the conductor layers 32 and 43, and the end portion 50b, at which the terminals 59 and 58 are formed, is formed on the same side as the positive terminal 34 and the negative terminal 44. Thus, downsizing of the semiconductor device 10 is achieved.

In addition, the circuit board 50 of the semiconductor device 10 is formed in the space S2 formed between the conductor layer 43 of the board 40 and the two semiconductor elements 20 connected to each other via the bonding material 70, the conductor blocks 80, and the bonding material 90. In addition, the gate electrode 23 and the emitter electrode 22 of the individual semiconductor element 20 are connected to the circuit board 50. In this way, downsizing of the semiconductor device 10 is achieved.

Figure 16:
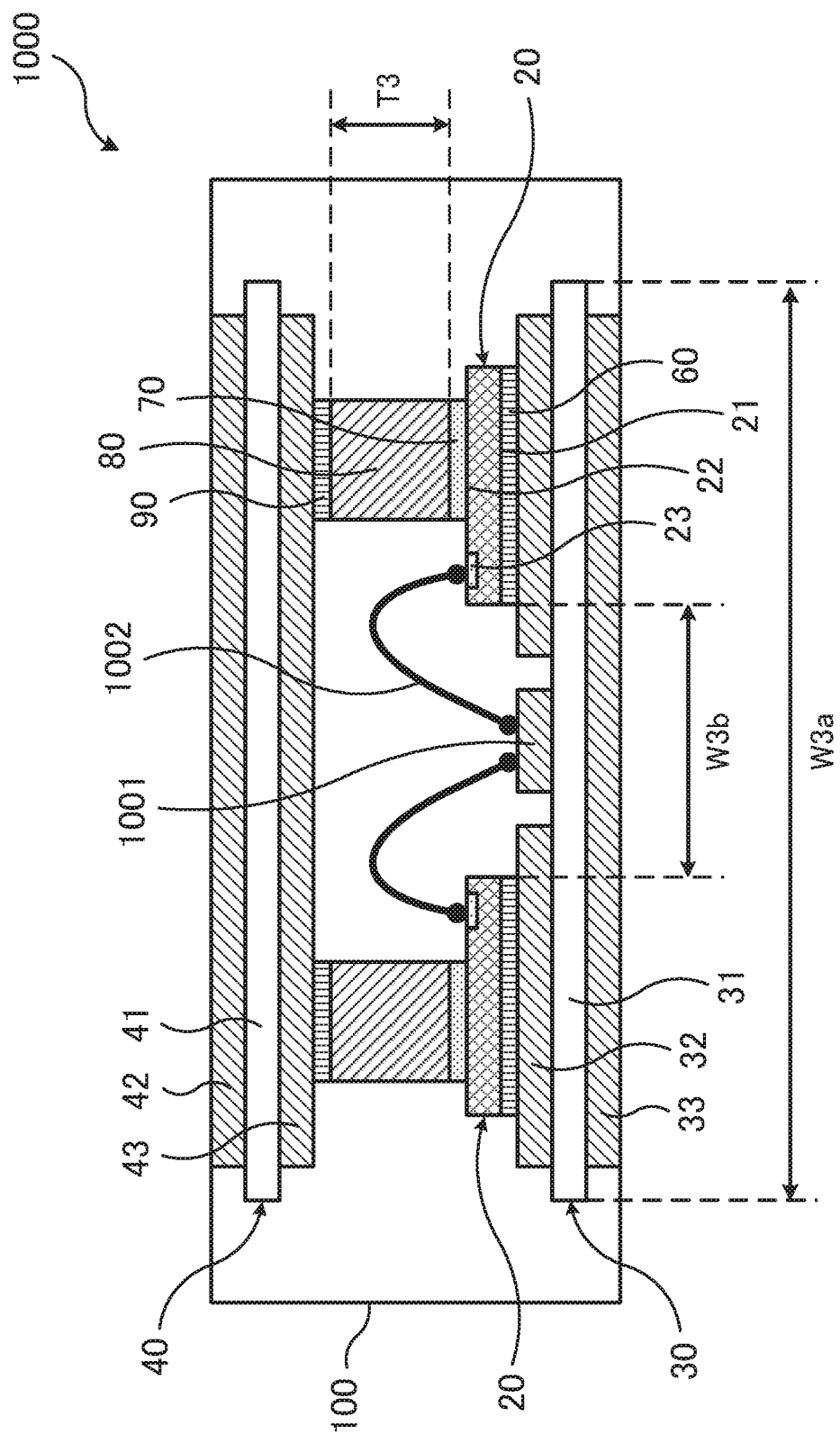
FIG. 16 illustrates an example of a semiconductor device according to a different mode.

Next, for comparison, an example of a semiconductor device according to a different mode will be described with reference to FIG. 16. FIG. 16 is a schematic cross section of a main part of an example of a semiconductor device.

This semiconductor device 1000 illustrated in FIG. 16 includes two semiconductor elements 20 and board 30 and 40 that face each other via the two semiconductor elements 20. A collector electrode 21 of the individual semiconductor element 20 is connected to a conductor layer 32 of the board 30 via bonding material 60, and an emitter electrode 22 thereof is connected to a conductor layer 43 of the board 40 via bonding material 70, a conductor block 80, and bonding material 90. In the case of the semiconductor device 1000, in addition to the conductor layer 32 to which the collector electrode 21 of the individual semiconductor element 20 is connected, a wiring pattern 1001 is formed on an insulating plate 31 of the board 30 separately from the conductor layer 32. For example, the wiring pattern 1001 is formed in a region between the two semiconductor elements 20. For example, a gate electrode 23 of the individual semiconductor element 20 is connected to the wiring pattern 1001 via a wire 1002. A switching control voltage is applied to the gate electrode 23 of the individual semiconductor element 20 via the wiring pattern 1001 and the wire 1002.

In the case of the semiconductor device 1000, along with the conductor layer 32, the wiring pattern 1001 connected to the gate electrode 23 of the individual semiconductor element 20 via the wire 1002 is formed on the board 30. Thus, the board 30 has a relatively large width W3a. In addition, since the wiring pattern 1001 of the semiconductor device 1000 is formed in a region between the two semiconductor elements 20, a width W3b between the semiconductor elements 20 is relatively large.

In contrast, the circuit board 50 is used in the semiconductor device 10 according to the second embodiment, and the wiring pattern 1001 as formed in the semiconductor device 1000 does not need to be formed on the board 30. In addition, since the wiring pattern 1001 does not need to be formed, the two semiconductor elements 20 are formed on the board 30 with a shorter distance therebetween. As a result, the board 30 of the semiconductor device 10 has a width W2a (FIG. 12) smaller than the width W3a (FIG. 16) of the board 30 of the semiconductor device 1000. In addition, the pair of semiconductor elements 20 of the semiconductor device 10 has a width W2b (FIG. 12) smaller than the width W3b (FIG. 16) of the pair of semiconductor elements 20 of the semiconductor device 1000.

In addition, in the case of the semiconductor device 1000, since wire bonding is performed between the individual semiconductor element 20 and the wiring pattern 1001, interference with the board 40 needs to be avoided. Thus, a relatively large space, for example, a space of 2 mm or more, needs to be ensured between the board 40 and the semiconductor elements 20. In the case of the semiconductor device 1000, to ensure this space, the conductor blocks 80 having a relatively large thickness T3 are used.

In contrast, the circuit board 50 is used in the semiconductor device 10 according to the second embodiment, and for example, a circuit board having a thickness of 0.5 mm or less may be used as this circuit board 50. Thus, in the case of the semiconductor device 10, for example, the space S2 of 1 mm or less is only needed between the board 40 and the semiconductor elements 20. Thus, the conductor blocks 80 have a relatively small thickness. Therefore, the individual conductor block 80 of the semiconductor device 10 has a thickness T2 (FIG. 12) smaller than the thickness T3 (FIG. 16) of the individual conductor block 80 of the semiconductor device 1000.

The semiconductor device 10 achieves downsizing in any one of the planar and thickness directions.

In addition, since the semiconductor device 10 includes the thin conductor blocks 80 as described above, the distance between the conductor layer 32 of the board 30 and the conductor layer 43 of the board 40 through which the main current flows is shortened, and the mutual inductance is increased. As a result, the total inductance when switching control of the semiconductor elements 20 is performed is reduced.

In addition, in the case of the semiconductor device 10, the boards 30 and 40 are formed in the directions of the main surfaces 20a and 20b, respectively, of the individual semiconductor element 20 that generates heat when operated. In addition, both the conductor layers 33 and 42 formed on the outside of the boards 30 and 40 are exposed to the outside in the resin 100. Thus, compared with a semiconductor device including a conductor layer that is formed only in the direction of one main surface and that is exposed in the resin 100, the heat radiation efficiency and the cooling efficiency of the semiconductor elements 20 are improved. As a result, overheating of the semiconductor elements 20 is reduced. In addition, since the conductor blocks 80 of the semiconductor device 10 are allowed to have a smaller thickness as described above, thermal resistance between the individual semiconductor elements 20 and the board 40 is reduced, and overheating of the individual semiconductor elements 20 is consequently reduced. Since overheating of the individual semiconductor elements 20 of the semiconductor device 10 is reduced, occurrence of breakage of the semiconductor elements 20 due to overheating is reduced. Since overheating of the individual semiconductor elements 20 of the semiconductor device 10 and occurrence of breakage of the individual semiconductor elements 20 due to overheating are reduced, a larger current is allowed to flow through the semiconductor elements 20.

In addition, in the case of the semiconductor device 10, the circuit board 50 is formed over the two semiconductor elements 20 formed opposite to each other on the conductor layer 32 of the board 30. In this way, since the length of an electrical signal path between one semiconductor element 20 and the circuit board 50 is made equal to that of an electrical signal path between the other semiconductor element 20 and the circuit board 50, the controllability of the operation of the two semiconductor elements 20 is improved.

The above configuration enables the semiconductor device 10 to have a small size and semiconductor elements 20 having excellent operation performance.

The semiconductor device 10 may be provided in plurality and connected in parallel to or in series with each other.

Figure 17:
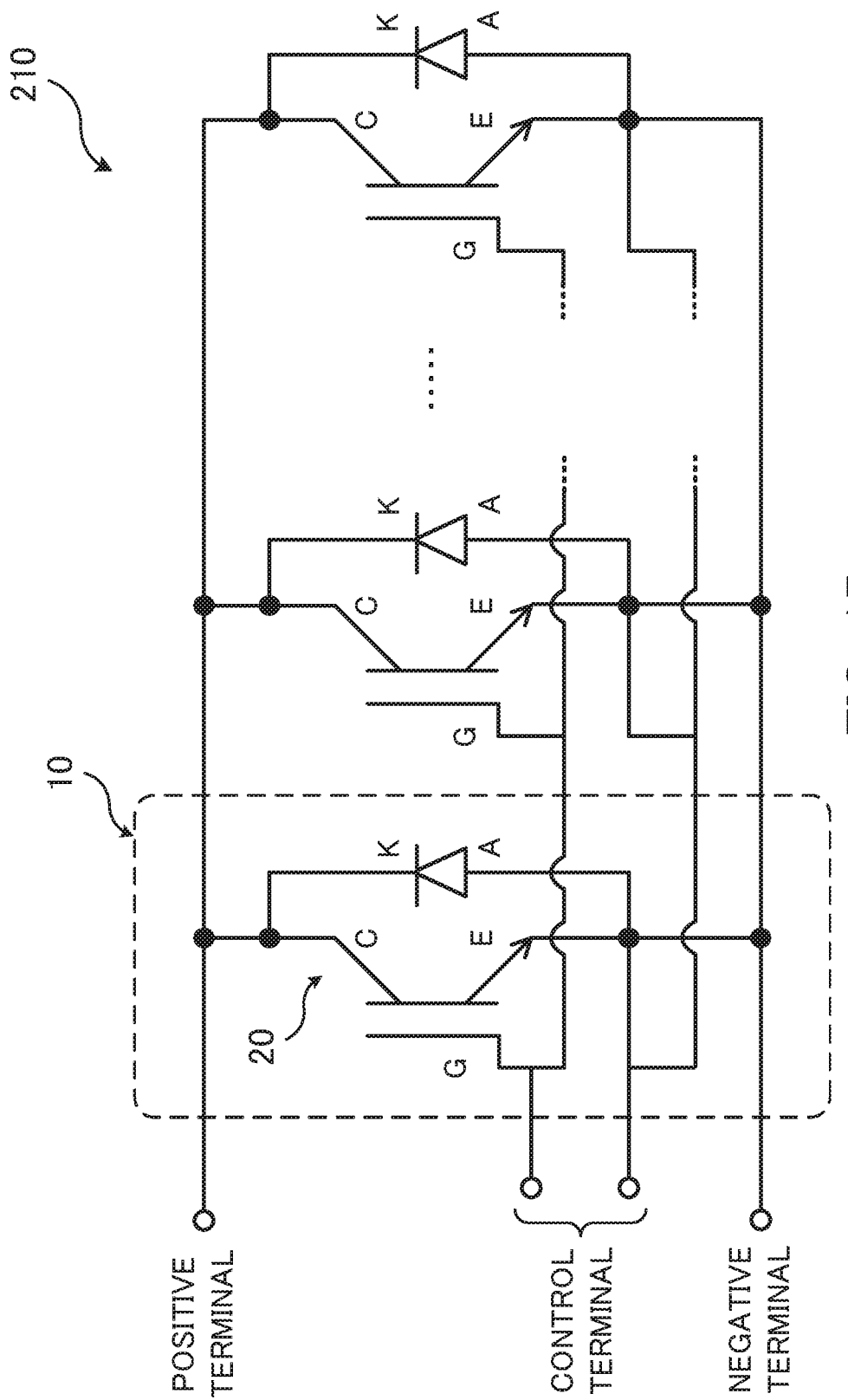
FIG. 17 illustrates a connection example of semiconductor devices according to the second embodiment.
Figure 18:
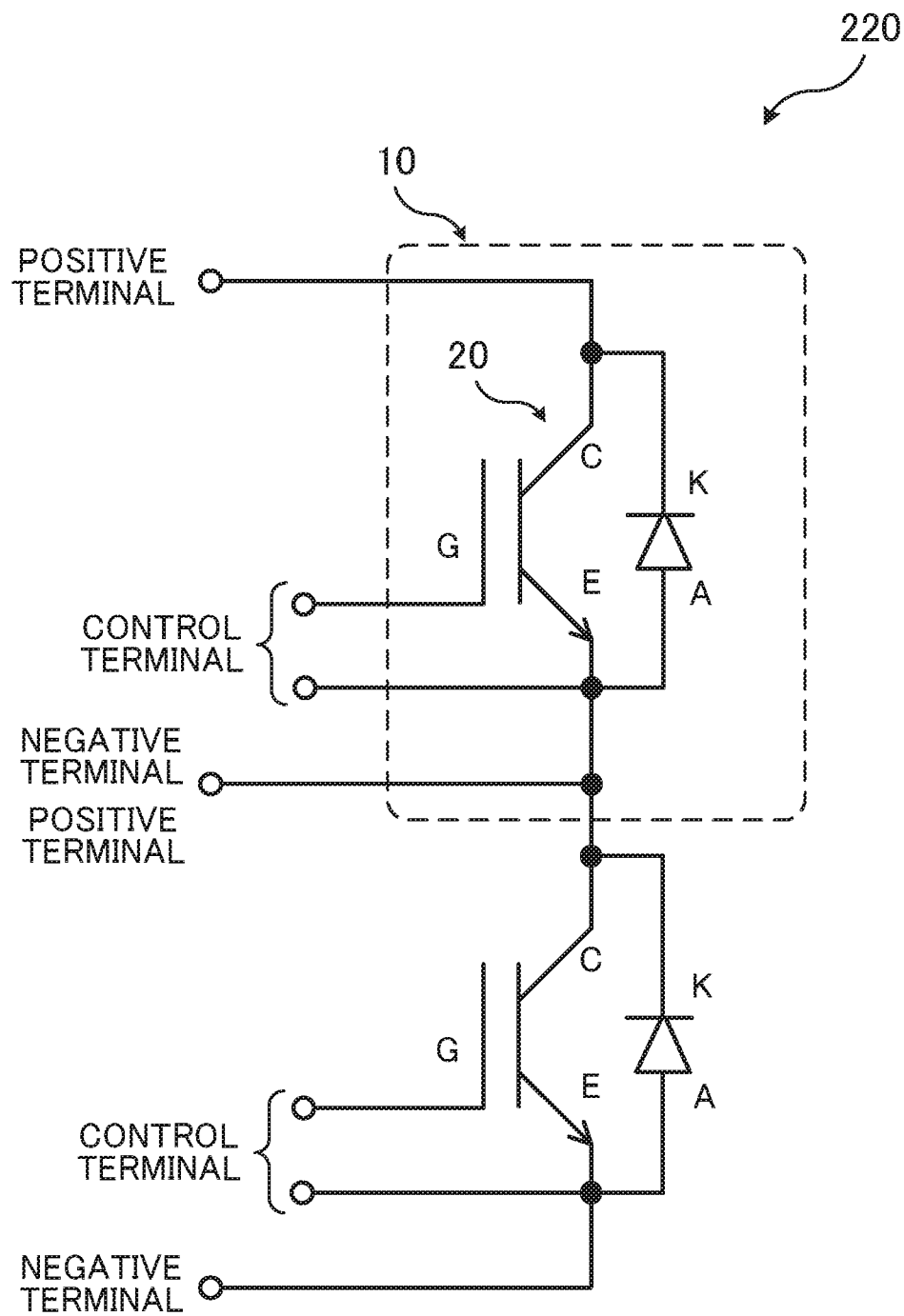
FIG. 18 illustrates another connection example of semiconductor devices according to the second embodiment.

FIGS. 17 and 18 illustrate connection examples of semiconductor devices according to the second embodiment. FIG. 17 illustrates an equivalent circuit of a group of semiconductor devices connected in parallel to each other. FIG. 18 illustrates an equivalent circuit of a group of semiconductor devices connected in series with each other.

For example, as illustrated in FIG. 17, the positive terminals 34 of a plurality of semiconductor devices 10 (semiconductor modules) are electrically connected to each other via a bus bar or the like, and the negative terminals 44 are electrically connected to each other via a bus bar or the like. In addition, the terminals 59 of the circuit boards 50 of the plurality of semiconductor devices 10 are electrically connected to each other via a bus bar or the like, and the terminals 58 of the circuit boards 50 are electrically connected to each other via a bus bar or the like. Consequently, a semiconductor device 210 (an electronic apparatus) in which the plurality of semiconductor devices 10 are connected in parallel to each other is formed. In FIG. 17, for convenience, the circuit configuration of an individual one of a plurality of (in this example, two) semiconductor elements 20, which are included in a single semiconductor device 10 and connected in parallel to each other, is represented by a combination of a transistor and a diode (an RC-IGBT in this example). In this way, a plurality of small semiconductor devices 10 are connected in parallel to each other, and the semiconductor device 210 having a small size is formed.

In addition, for example, as illustrated in FIG. 18, the negative terminal 44 and the positive terminal 34 of a plurality of (in this example, two) semiconductor devices 10 (semiconductor modules) are electrically connected to each other via a bus bar or the like, and a semiconductor device 220 (an electronic apparatus) in which the semiconductor devices 10 are connected in series with each other is formed. In FIG. 18, for convenience, the circuit configuration of an individual one of a plurality of (in this example, two) semiconductor elements 20, which are included in a single semiconductor device 10 and connected in series with each other, is represented by a combination of a transistor and a diode (an RC-IGBT in this example). In this way, a plurality of small semiconductor devices 10 are connected in series with each other, and the semiconductor device 220 having a small size is formed.

The above description has been made based on an example in which two semiconductor elements 20 are included in a single semiconductor device 10. However, the number of semiconductor elements 20 included in a single semiconductor device 10 is not limited to 2.

Figure 19:
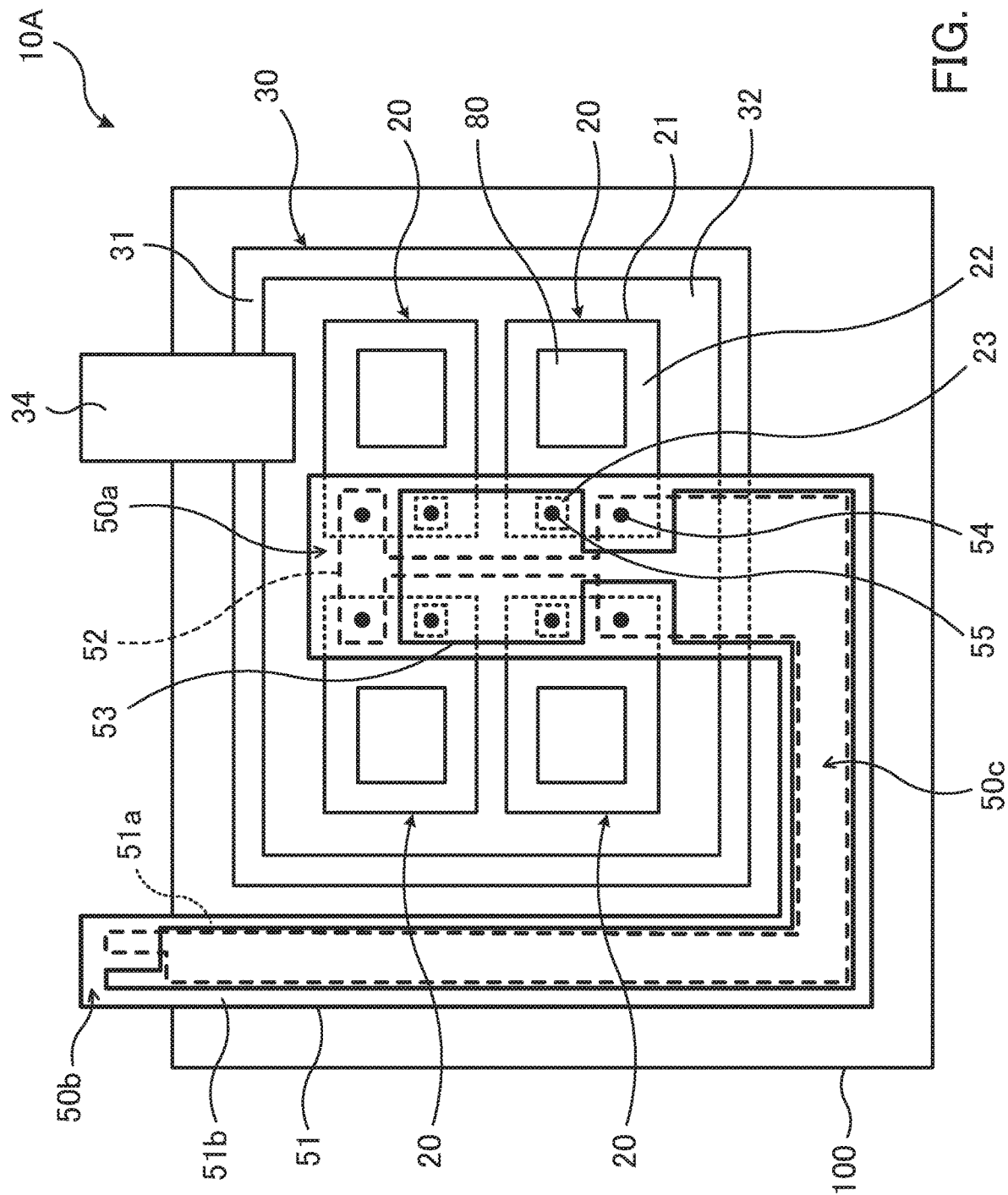
FIG. 19 illustrates a variation of the semiconductor device according to the second embodiment.

FIG. 19 illustrates a variation of the semiconductor device according to the second embodiment. FIG. 19 is a schematic plan view of a main part of the semiconductor device according to a variation.

In FIG. 19, for convenience, illustration of the board 40 on which the negative terminals 44 are formed is omitted. For example, this semiconductor device 10A illustrated in FIG. 19 includes four semiconductor elements 20. The same kind or different kinds of semiconductor elements 20 may be used as the four semiconductor elements 20.

For example, RC-IGBTs are used as the four semiconductor elements 20. In this case, the collector electrodes 21 of the four semiconductor elements 20 are connected to the conductor layer 32 of the board 30 on which the positive terminals 34 are formed, and the emitter electrodes 22 of the four semiconductor elements 20 are connected to the conductor layer 43 of the board 40, on which the negative terminals 44 (not illustrated) are formed, via the conductor blocks 80, etc. One end portion 50a of the circuit board 50 is formed in the above space S2 formed between the board 40 and the four semiconductor elements 20 not illustrated via the conductor blocks 80, etc., and the intermediate portion 50c is extended to be located outside the board 30 (and the board 40) in plan view. The other end portion 50b is extended in the direction of the positive terminal 34 of the board 30 (and the negative terminal 44 of the board 40).

The wiring layer 53 is formed on one main surface 51b of the insulating layer 51 of the circuit board 50. The wiring layer 53 is connected to the gate electrodes 23 of the four semiconductor elements 20 at the end portion 50a via the conductor portions 55 such as pins (and the connection portion 57). The wiring layer 52 is formed on the other main surface 51a of the insulating layer 51 of the circuit board 50. The wiring layer 52 is connected to the emitter electrodes 22 of the four semiconductor elements 20 at the end portion 50a via the conductor portions 54 such as pins (and the connection portions 56). The wiring layers 53 and 52 are formed to overlap with each other in plan view at the intermediate portion 50c of the circuit board 50.

The semiconductor device 10A in which the four semiconductor elements 20 of RC-IGBTs are connected in parallel to each other may be also formed, as illustrated in FIG. 19. The semiconductor device 10A having the configuration as illustrated in FIG. 19 achieves the same advantageous effects as those of the above semiconductor device 10.

Alternatively, a semiconductor device including three semiconductor elements 20 or five or more semiconductor elements 20 may be formed.

Third Embodiment

Figure 20:
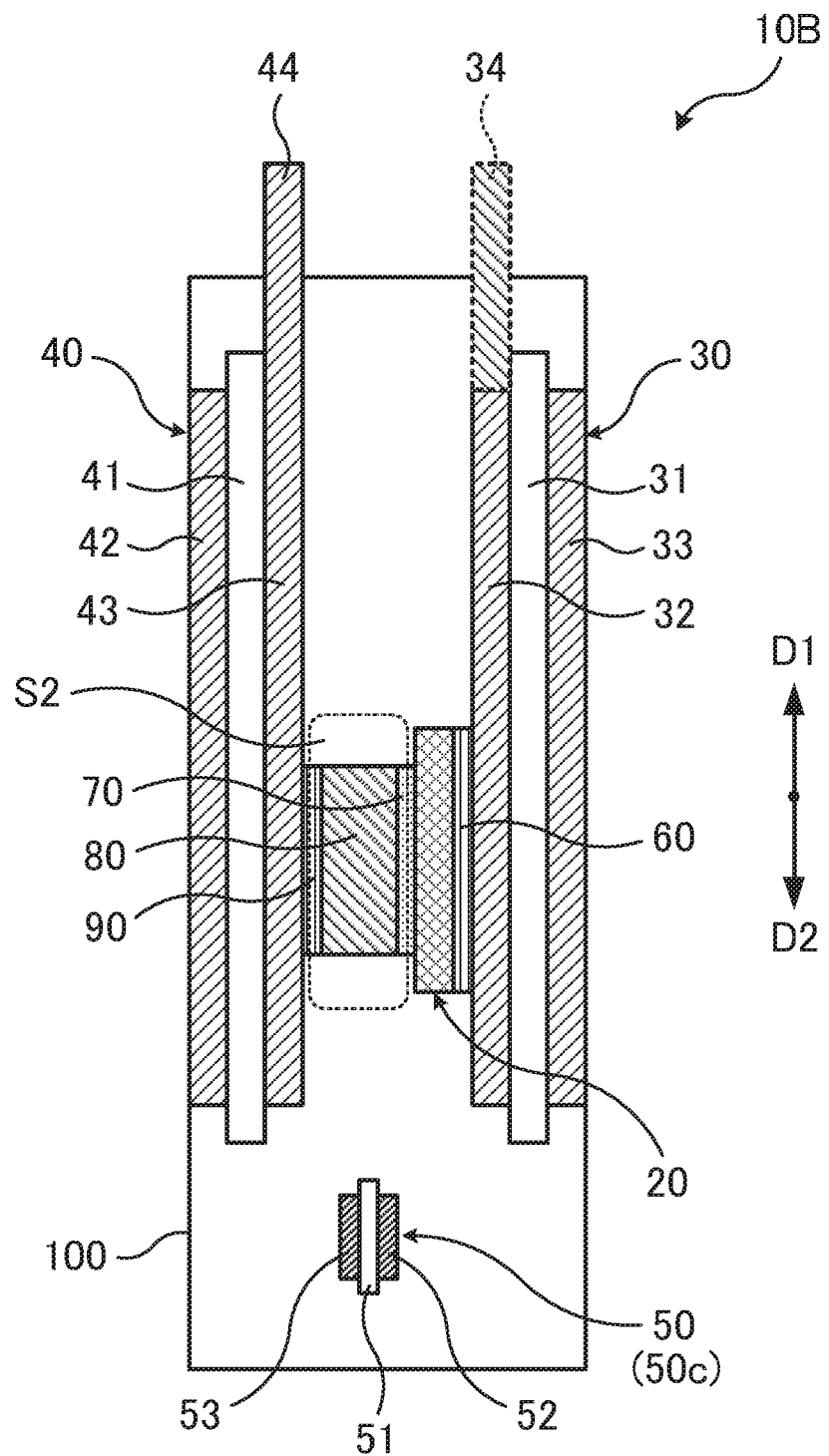
FIG. 20 illustrates an example of a semiconductor device according to a third embodiment.

FIG. 20 illustrates an example of a semiconductor device according to a third embodiment. FIG. is a schematic cross section of a main part of an example of the semiconductor device.

This semiconductor device 10B illustrated in FIG. 20 differs from the semiconductor device 10 according to the second embodiment in that the positive terminal 34 is integrated with the conductor layer 32 (formed as a part of the conductor layer 32) and the negative terminal 44 is integrated with the conductor layer 43 (formed as a part of the conductor layer 43). As is the case with the above semiconductor device 10, a plurality of semiconductor elements 20 are included in the semiconductor device 10B. In FIG. 20, for convenience, the positive terminal 34 is schematically illustrated by a dotted line.

The board 30 whose conductor layer 32 is integrated with the positive terminal 34 is obtained, for example, by bonding the conductor layer 32 integrated with the positive terminal 34 to the insulating plate 31. The board 40 whose conductor layer 43 is integrated with the negative terminal 44 is obtained, for example, by bonding the conductor layer 43 integrated with the negative terminal 44 to the insulating plate 41.

Each of the conductor layer 32 integrated with the positive terminal 34 and the conductor layer 43 integrated with the negative terminal 44 includes a portion including a region where a semiconductor element 20 is mounted, for example. Conductor plates corresponding to the positive terminal 34 and the negative terminal 44 are extended from this portion. A Lead frame may be used for the conductor layer 32 integrated with the positive terminal 34 and the conductor layer 43 integrated with the negative terminal 44. In this lead frame, die pads are formed in the region where semiconductor elements 20 is mounted, and leads corresponding to the positive terminal 34 and the negative terminal 44 are extended from these die pads.

The semiconductor device 10B having the configuration as illustrated in FIG. 20 also achieves the same advantageous effects as those of the semiconductor device 10 according to the second embodiment.

This semiconductor device 10B according to the third embodiment may be provided in plurality and connected in parallel to or in series with each other in accordance with the examples (FIGS. 17 and. 18) according to the second embodiment.

Fourth Embodiment

Figure 21A:
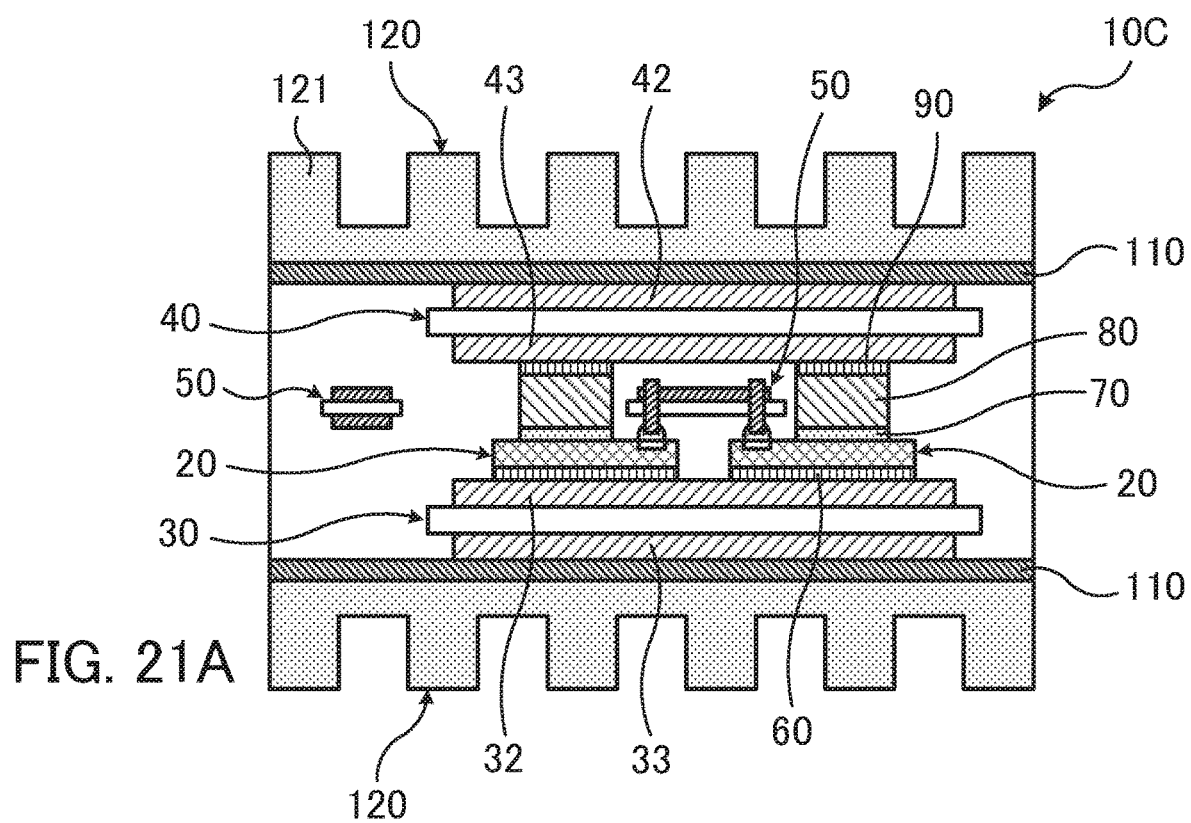
FIGS. 21A and 21B illustrate examples of a semiconductor device according to a fourth embodiment.
Figure 21B:
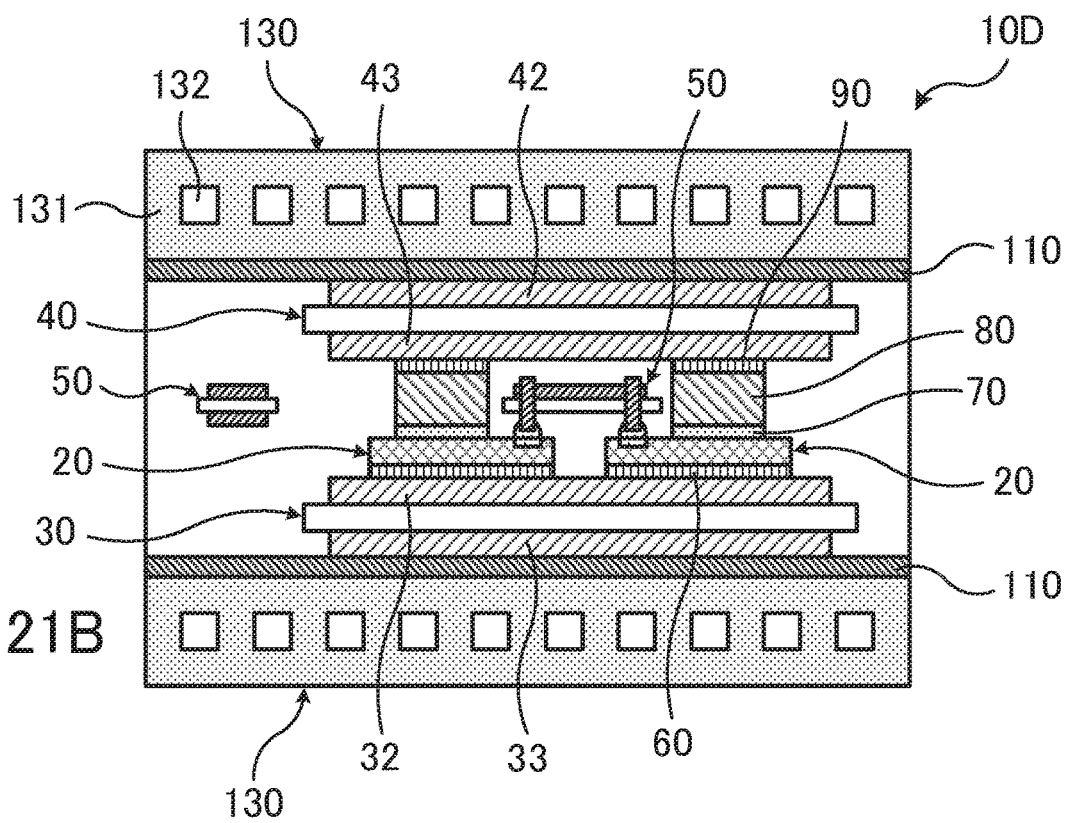

FIGS. 21A and 21B illustrate examples of a semiconductor device according to a fourth embodiment. Each of FIGS. 21A and 21B is a schematic cross section of a main part of an example of the semiconductor device.

This semiconductor device 10C illustrated in FIG. 21A includes cooling members 120, each of which includes a plurality of fins 121. The cooling members 120 are formed on the resin 100 and the conductor layer 33 of the board 30 and the conductor layer 42 of the board 40 exposed in the resin 100 of the semiconductor device 10 (FIG. 12, etc.) according to the second embodiment via thermal interface material 110. The thermal interface material 110 may be bonding material such as thermal grease or sintered material or solder of copper, silver, or the like.

While heat is generated when the semiconductor elements 20 of the semiconductor device 10C are operated, this heat is transferred to the board 30 via the bonding material 60 and to the board 40 via the bonding material 70, the conductor blocks 80, and the bonding material 90. The heat transferred to the boards 30 and 40 is transferred to the cooling members 120 via the thermal interface material 110 and exchanged with the outside air.

As described above, the semiconductor device 10C releases the heat generated from the semiconductor elements 20 to both of the main surfaces. In addition, the conductor layer 33 of the board 30 and the conductor layer 42 of the board 40 are exposed in the resin 100 of the semiconductor device 10C, and the cooling members 120 are thermally connected to the conductor layers 33 and 42 exposed in the resin 100 via the thermal interface material 110. In this way, the heat is efficiently released from the semiconductor elements 20 to the cooling members 120 on both of the main surfaces, and the semiconductor elements 20 is efficiently cooled. Since the semiconductor elements 20 are efficiently cooled, overheating of the semiconductor elements 20 and occurrence of breakage of the semiconductor elements 20 due to overheating are reduced. Consequently, a larger current is allowed to flow through the semiconductor elements 20.

The cooling members 120 of the semiconductor device 10C may be formed to come into contact with the conductor layers 33 and 42 without forming the thermal interface material 110.

A semiconductor device 10D illustrated in FIG. 21B includes cooling members 130 on the resin 100 and the conductor layer 33 of the board 30 and the conductor layer 42 of the board 40 exposed in the resin 100 of the semiconductor device 10 (FIG. 12, etc.) according to the second embodiment via thermal interface material 110. Each of the cooling members 130 of the semiconductor device 10D includes a main body part 131 and refrigerant flow paths 132 which are formed in the main body part 131 and through which liquid or gaseous refrigerant flow.

In the case of the semiconductor device 10D, the heat generated when the semiconductor elements 20 are operated is transferred to the board 30 via the bonding material 60 and to the board 40 via the bonding material 70, the conductor blocks 80, and the bonding material 90. The heat transferred to the boards 30 and 40 is transferred to the cooling members 130 via the thermal interface material 110 and is exchanged with the refrigerant that flows through the refrigerant flow paths 132.

As described above, in the case of the semiconductor device 10D, as is the case with the above semiconductor device 10C, the heat is efficiently released from the semiconductor elements 20 to the cooling members 130 formed on both of the main surfaces of the semiconductor device 10D. Thus, the semiconductor elements 20 are efficiently cooled. Since the semiconductor elements 20 are efficiently cooled, overheating of the semiconductor elements 20 and occurrence of breakage of the semiconductor elements 20 due to overheating are reduced. In addition, a larger current is allowed to flow through the semiconductor elements 20.

The cooling members 130 of the semiconductor device 10D may be formed to come into contact with the conductor layers 33 and 42 without forming the thermal interface material 110.

The semiconductor devices 10C and 10D may include three or more semiconductor elements 20.

The above description has been made based on examples in which the cooling members 120 or 130 are formed on the semiconductor device 10 according to the second embodiment. However, the cooling members 120 or 130 may also be formed on the semiconductor device 10A (FIG. 19) according to the second embodiment and the semiconductor device 10B (FIG. 20) according to the third embodiment. Other than the above cooling members 120 and 130, various kinds of cooling members may be formed on the semiconductor device 10 or the like. For example, a cooling member that uses evaporation and condensation of internally sealed operating fluid may be used.

In addition, the semiconductor device 10C or 10D according to the fourth embodiment may be provided in plurality and connected in parallel to or in series with each other in accordance with the examples according to the second embodiment (FIGS. 17 and 18).

Fifth Embodiment

Figure 22A:
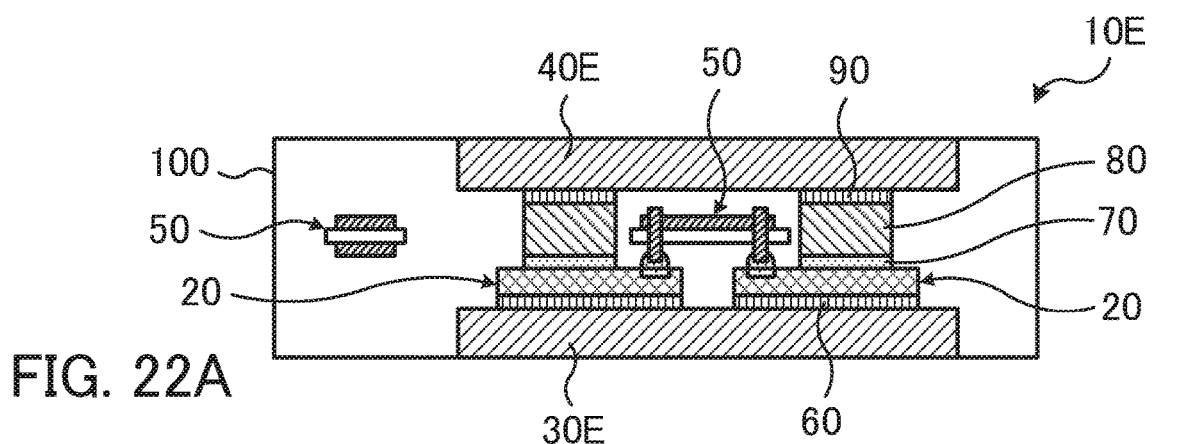
FIGS. 22A to 22C illustrate examples of a semiconductor device according to a fifth embodiment.
Figure 22B:
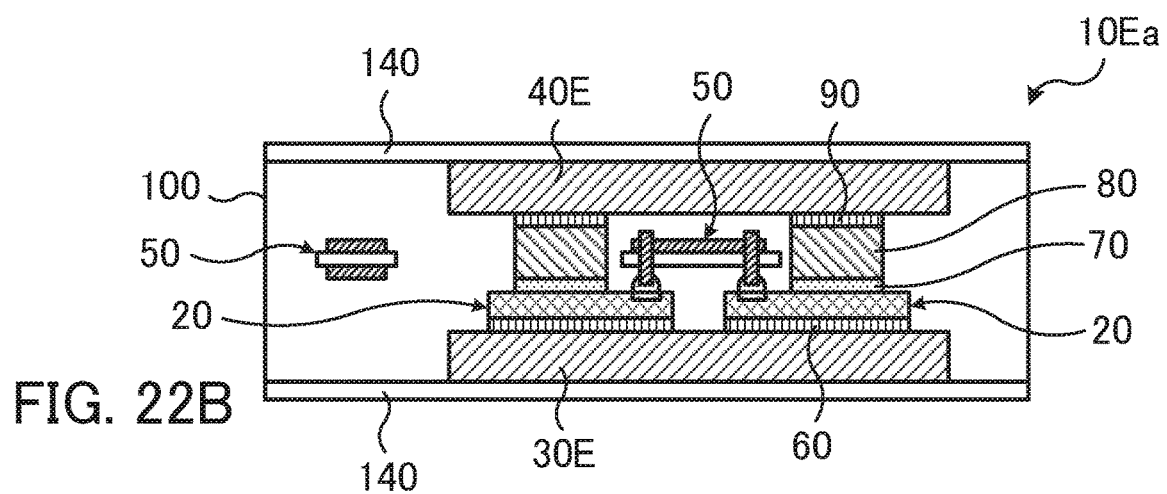
Figure 22C:
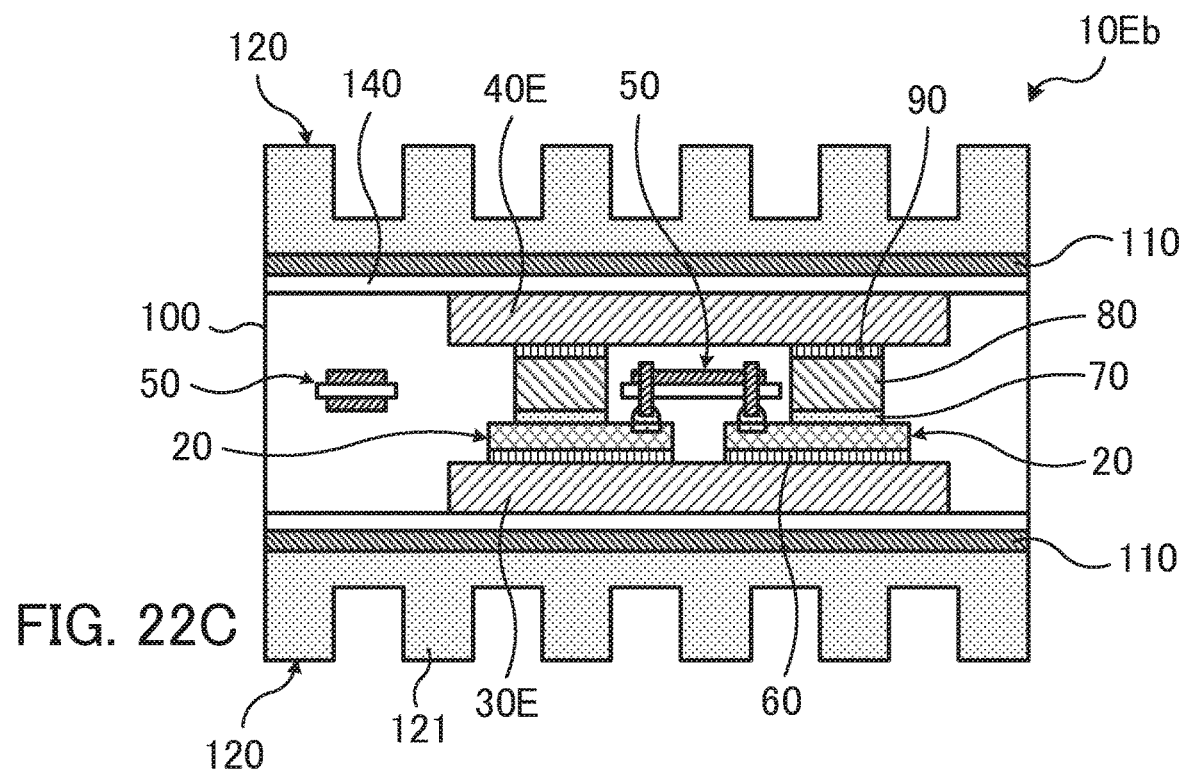

FIGS. 22A to 22C illustrate examples of a semiconductor device according to a fifth embodiment. Each of FIGS. 22A to 22C is a schematic cross section of a main part of an example of the semiconductor device.

This semiconductor device 10E illustrated in FIG. 22A includes semiconductor elements 20 (in this example, two semiconductor elements 20 in a sectional view) between a conductor plate 30E and a conductor plate 40E facing each other. The conductor plates 30E and 40E are examples of conductor layers. The conductor plate 30E is provided with a positive terminal 34, and the other conductor plate 40E is provided with a negative terminal 44. The collector electrode 21 of the individual semiconductor element 20 is connected to a main surface of the conductor plate 30E via bonding material 60, the main surface being in the direction of the semiconductor element 20. The emitter electrode 22 of the individual semiconductor element 20 is connected to a main surface of the conductor plate 40E via bonding material 70, a conductor block 80, and bonding material 90, the main surface being in the direction of the semiconductor element 20. The gate electrode 23 and the emitter electrode 22 of the individual semiconductor element 20 are connected to a circuit board 50. The conductor plates 30E and 40E, the semiconductor element 20, etc. are sealed by the resin 100 so that a part of the positive terminal 34, a part of the negative terminal 44, an end portion 50*b* (not illustrated) of the circuit board 50, and main surfaces of the conductor plates 30E and 40E, the main surfaces being opposite to the individual semiconductor element 20, are exposed to the outside.

The semiconductor device 10E includes the conductor plates 30E and 40E in place of the boards 30 and 40 of the semiconductor device 10 according to the second embodiment. The semiconductor device 10E (and semiconductor devices 10Ea and 10Eb to be described below) may include three or more semiconductor elements 20. The semiconductor device 10E also provides the same advantageous effects as those of the semiconductor device 10 according to the second embodiment.

As in the semiconductor device 10Ea in FIG. 22B, insulating layers (or insulating plates) 140 may be formed on the resin 100 of the semiconductor device 10E illustrated in FIG. 22A and the conductor plates 30E and 40E exposed therein. For example, as the individual insulating layer 140, a relatively dense ceramic layer is formed by using an aerosol deposition method. In accordance with such a method, the insulating layers 140 are allowed to have high insulating performance and a small thickness, and as a result, the thin semiconductor device 10Ea whose surfaces are protected by the insulating layers 140 is formed.

As in the semiconductor device 10Eb illustrated in FIG. 22C, cooling members 120, each of which has a plurality of fins 121, may be formed on the insulating layers 140 of the semiconductor device 10Ea illustrated in FIG. 22B via thermal interface material 110 in accordance with the example (FIG. 21A) according to the fourth embodiment. In this way, the heat is effectively released from the semiconductor elements 20 to the conductor plates 30E and 40E formed on the two main surfaces thereof and the cooling members 120. Thus, since the semiconductor elements 20 are effectively cooled, overeating of the semiconductor elements 20 and occurrence of breakage of the semiconductor elements 20 due to overeating are reduced. In addition, a larger current is allowed to flow through the semiconductor elements 20. In accordance with the example (FIG. 21B) according to the fourth embodiment, the cooling members 130, each of which has refrigerant flow paths 132 in the corresponding main body part 131, may be formed on the insulating layers 140 of the semiconductor device 10Ea via the thermal interface material 110. Various kinds of cooling members such as cooling members that use evaporation and condensation of internally sealed operating fluid may be formed on the insulating layers 140.

Regarding the semiconductor devices 10E, 10Ea, and 10Eb, the positive terminal 34 may be integrated with the conductor plate 30E (formed as a part of the conductor plate 30E), and the negative terminal 44 may be integrated with the conductor plate 40E (formed as a part of the conductor plate 40E) in accordance with the example according to the third embodiment.

In addition, in accordance with the examples (FIG. 17 and FIG. 18) according to the second embodiment, the semiconductor device 10E, 10Ea or 10Eb according to the fifth embodiment may be provided in plurality and connected in parallel to or in series with each other.

In one aspect, a small semiconductor device whose semiconductor elements having excellent operation performance is formed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor module including
      a first conductor layer,
      a second conductor layer that faces the first conductor layer,
      a group of semiconductor elements formed between the first conductor layer and the second conductor layer,
      a group of conductor blocks that are formed between the second conductor layer and the group of semiconductor elements, and respectively via which the group of semiconductor elements are connected to the second conductor layer, a space being formed between the second conductor layer and the group of semiconductor elements, and
      a circuit board having one end portion thereof located in said space,
   wherein each of the semiconductor elements includes
      a first main electrode that is formed on a first main surface thereof facing the first conductor layer and that is electrically connected to the first conductor layer,
      a second main electrode that is formed on a second main surface thereof facing the second conductor layer and that is electrically connected to the second conductor layer via the respective conductor block, and
      a control electrode that is formed on the second main surface, and
   wherein the circuit board includes a first wiring layer electrically connected to the control electrodes of the semiconductor elements.

2. The semiconductor device according to claim 1, further comprising a group of first conductor connection portions that electrically connect the first wiring layer and the control electrodes of the semiconductor elements.

3. The semiconductor device according to claim 1, wherein the circuit board includes an insulating layer, and the first wiring layer is formed on one main surface of the insulating layer.

4. The semiconductor device according to claim 3, wherein the circuit board further includes a second wiring layer that is formed on another main surface of the insulating layer and that is electrically connected to the second main electrodes of the semiconductor elements.

5. The semiconductor device according to claim 4, further comprising a group of second conductor connection portions that electrically connect the second wiring layer and the second main electrodes of the semiconductor elements.

6. The semiconductor device according to claim 4, wherein a part of the first wiring layer and a part of the second wiring layer overlap each other in a plan view of the semiconductor device.

7. The semiconductor device according to claim 1, further comprising:
   a first terminal formed at an edge of the first conductor layer at a first side of the semiconductor device in a plan view thereof; and
   a second terminal formed at an edge of the second conductor layer at the first side of the semiconductor device in the plan view thereof,
   wherein the circuit board extends beyond the first conductor layer and the second conductor layer at a second side of the semiconductor device opposite to the first side in the plan view.

8. The semiconductor device according to claim 1, further comprising:
   a first terminal formed at an edge of the first conductor layer at a first side of the semiconductor device in a plan view thereof; and
   a second terminal formed at an edge of the second conductor layer at the first side of the semiconductor device in the plan view thereof,
   wherein the circuit board has another end portion that extends beyond the first conductor layer and the second conductor layer in the plan view and that is formed beside the first terminal and the second terminal.

9. A semiconductor device, comprising:
   a plurality of semiconductor modules that are connected in parallel or in series, each of the semiconductor modules including
      a first conductor layer,
      a second conductor layer that faces the first conductor layer,
      a group of semiconductor elements formed between the first conductor layer and the second conductor layer,
      a group of conductor blocks that are formed between the second conductor layer and the group of semiconductor elements, and respectively via which the group of semiconductor elements are connected to the second conductor layer, a space being formed between the second conductor layer and the group of semiconductor elements, and
      a circuit board having one end portion thereof located in said space,
   wherein each of the semiconductor elements includes
      a first main electrode that is formed on a first main surface thereof facing the first conductor layer and that is electrically connected to the first conductor layer,
      a second main electrode that is formed on a second main surface thereof facing the second conductor layer and that is electrically connected to the second conductor layer via the respective conductor block, and
      a control electrode that is formed on the second main surface, and
   wherein the circuit board includes a first wiring layer electrically connected to the control electrodes of the semiconductor elements.

* * * * *